United States Patent
Kudou et al.

(10) Patent No.: US 9,087,894 B2
(45) Date of Patent: Jul. 21, 2015

(54) SEMICONDUCTOR DEVICE AND METHOD OF MANUFACTURING THE DEVICE

(75) Inventors: Chiaki Kudou, Hyogo (JP); Tsutomu Kiyosawa, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 81 days.

(21) Appl. No.: 13/811,057

(22) PCT Filed: Sep. 10, 2012

(86) PCT No.: PCT/JP2012/005716
§ 371 (c)(1),
(2), (4) Date: Jan. 18, 2013

(87) PCT Pub. No.: WO2013/118203
PCT Pub. Date: Aug. 15, 2013

(65) Prior Publication Data
US 2013/0341643 A1      Dec. 26, 2013

(30) Foreign Application Priority Data

Feb. 10, 2012   (JP) ................................. 2012-027074

(51) Int. Cl.
*H01L 29/78*  (2006.01)
*H01L 29/66*  (2006.01)
(Continued)

(52) U.S. Cl.
CPC ........ *H01L 29/7827* (2013.01); *H01L 29/0634* (2013.01); *H01L 29/0847* (2013.01); *H01L 29/0856* (2013.01); *H01L 29/42376* (2013.01); *H01L 29/66068* (2013.01);
(Continued)

(58) Field of Classification Search
CPC ............ H01L 29/1602; H01L 29/1608; H01L 29/66068; H01L 29/66666; H01L 29/7827
USPC ........................................................... 257/77
See application file for complete search history.

(56) References Cited

U.S. PATENT DOCUMENTS 5,915,180 A      6/1999   Hara et al.
5,963,807 A *  10/1999   Ueno ............................ 438/268
(Continued)

FOREIGN PATENT DOCUMENTS

JP       07-326755 A    12/1995
JP       09-074193 A     3/1997
(Continued)

OTHER PUBLICATIONS

International Search Report issued in International Patent Application No. PCT/JP2012/005716 dated Nov. 6, 2012.

*Primary Examiner* — Matthew W Such
*Assistant Examiner* — Warren H Kilpatrick
(74) *Attorney, Agent, or Firm* — McDermott Will & Emery LLP

(57) ABSTRACT

A first first-conductivity-type impurity region (4) is provided in an upper portion of a semiconductor layer (102) around a trench (12). A gate electrode (8) is provided on a sidewall surface of the trench (12), and on the semiconductor layer (102) around the trench (12) with a gate insulating film (11) interposed therebetween. A second-conductivity-type impurity region (50) and a second first-conductivity-type impurity region (51) are interposed between a portion of the gate electrode (8) around the trench (12) and the first first-conductivity-type impurity region (4) sequentially on the first first-conductivity-type impurity region (4).

20 Claims, 26 Drawing Sheets

(51) Int. Cl.
  *H01L 29/739* (2006.01)
  *H01L 29/06* (2006.01)
  *H01L 29/08* (2006.01)
  H01L 29/16 (2006.01)
  H01L 21/04 (2006.01)
  H01L 29/417 (2006.01)
  H01L 29/423 (2006.01)
  H01L 29/04 (2006.01)

(52) U.S. Cl.
  CPC ..... *H01L 29/66666* (2013.01); *H01L 29/7397* (2013.01); *H01L 29/7813* (2013.01); *H01L 29/7828* (2013.01); *H01L 21/0445* (2013.01); *H01L 21/0475* (2013.01); *H01L 29/045* (2013.01); *H01L 29/0696* (2013.01); *H01L 29/1608* (2013.01); *H01L 29/41766* (2013.01); *H01L 29/4236* (2013.01); *H01L 29/42368* (2013.01)

(56) References Cited

U.S. PATENT DOCUMENTS

| | | | |
|---|---|---|---|
| 5,976,936 A | 11/1999 | Miyajima et al. | |
| 6,020,600 A * | 2/2000 | Miyajima et al. | 257/76 |
| 6,573,534 B1 | 6/2003 | Kumar et al. | |
| 6,638,850 B1 | 10/2003 | Inagawa et al. | |
| 6,852,597 B2 * | 2/2005 | Park et al. | 438/268 |
| 7,994,513 B2 * | 8/2011 | Yamamoto et al. | 257/77 |
| 2001/0008291 A1 | 7/2001 | Aoki et al. | |
| 2002/0167046 A1 | 11/2002 | Aoki et al. | |
| 2004/0046190 A1 | 3/2004 | Inagawa et al. | |
| 2005/0090060 A1 | 4/2005 | Aoki et al. | |
| 2005/0127437 A1 | 6/2005 | Inagawa et al. | |
| 2006/0252192 A1 | 11/2006 | Inagawa et al. | |
| 2008/0233696 A1 | 9/2008 | Inagawa et al. | |
| 2009/0114980 A1 | 5/2009 | Pang | |
| 2010/0193863 A1 | 8/2010 | Inagawa et al. | |

FOREIGN PATENT DOCUMENTS

| | | |
|---|---|---|
| JP | 2000-196075 A | 7/2000 |
| JP | 2000-223705 A | 8/2000 |
| JP | 2000-294778 A | 10/2000 |
| JP | 2001-196587 A | 7/2001 |
| JP | 2004-140086 A | 5/2004 |
| JP | 2006-059940 A | 3/2006 |
| JP | 2007-043208 A | 2/2007 |
| JP | 2007-242943 A | 9/2007 |
| JP | 2007-281512 A | 10/2007 |
| JP | 2009-117828 A | 5/2009 |

* cited by examiner (a)

(b)

(c)

(d)

(a)

(b)

(c)

US 9,087,894 B2

SEMICONDUCTOR DEVICE AND METHOD OF MANUFACTURING THE DEVICE

This application is the U.S. National Phase under 35 U.S.C. §371 of International Application No. PCT/JP2012/005716, filed on Sep. 10, 2012, which in turn claims the benefit of Japanese Application No. 2012-027074, filed on Feb. 10, 2012, the disclosures of which Applications are incorporated by reference herein.

TECHNICAL FIELD

The present disclosure relates to semiconductor devices and methods of manufacturing the devices, and more particularly to semiconductor devices having a trench gate structure, and methods of manufacturing the devices.

BACKGROUND ART

In recent years, semiconductor devices having a trench gate structure have been focused on. While a channel region is formed on the surface of a semiconductor layer in a semiconductor device having a planar gate structure, a channel region is formed on the sidewall surface of a trench provided in a semiconductor layer in a semiconductor device having the trench gate structure. Thus, in a semiconductor device having the trench gate structure, miniaturization and reduction in on-resistance can be expected more than in a semiconductor device having the planar gate structure. Therefore, semiconductor devices having the trench gate structure are being developed particularly in the field of power devices.

Specifically, since miniaturization is not limited by the effect of junction field effect transistors (JFETs), a semiconductor device having the trench gate structure has the advantages of miniaturizing a trench, and reducing on-resistance and switching loss.

However, semiconductor devices having the trench gate structure have the problem of increasing gate resistance as a result of reduction in the cross-sectional area of a gate electrode with the miniaturization of a trench.

In order to address the problem, extending a gate electrode to the periphery of a trench, i.e., forming a T-shaped gate electrode is considered to mitigate an increase in gate resistance (see, for example, Patent Document1).

In a semiconductor device having the trench gate structure, forming an appropriate gate insulating film in a trench is important. Specifically, the thickness of the gate insulating film needs to be reduced on the sidewall surface of the trench, in which a channel region is formed, to reduce the threshold voltage at switching, and the thickness of the gate insulating film needs to be increased at the bottom of the trench to avoid electric field concentration.

However, if the thickness of the entire gate insulating film is increased to increase the breakdown electric field, the threshold voltage at switching increases. On the other hand, if the thickness of the entire gate insulating film is reduced to lower the threshold voltage at switching, the electric field concentration occurs at the bottom of the trench.

Then, for example, Patent Document 2 suggests forming a thicker gate insulating film at the bottom of a trench using the difference in the orientation between the sidewall surface and the bottom of the trench. For example, Patent Document 3 suggests selectively forming a mask on the sidewall surface of a trench in forming a gate insulating film, thereby preventing formation of an oxide film on the sidewall surface of the trench and forming the thick gate insulating film on the portions other than the sidewall surface of the trench.

CITATION LIST

Patent Document

PATENT DOCUMENT1: Japanese Patent Publication No. 2007-281512
PATENT DOCUMENT2: Japanese Patent Publication No. H7-326755
PATENT DOCUMENT3: Japanese Patent Publication No. 2007-242943

SUMMARY OF THE DISCLOSURE

Technical Problem

However, the conventional semiconductor devices having the trench gate structure have the following problems.

First, as shown in Patent Document 1, where the T-shaped gate electrode is formed, the gate insulating film needs to be formed on the portion of the semiconductor layer around the trench. However, if the gate insulating film formed around the trench has a small thickness, the parasitic capacitance between a gate and the semiconductor layer increases, thereby causing a delay and reducing the breakdown voltage of the gate insulating film between the gate and the semiconductor layer. Therefore, where the gate electrode has the T-shape, not only the thickness of the gate insulating film inside the trench but also the thickness of the gate insulating film around the trench is preferably controlled.

However, as shown in Patent Document 2, where the thickness of the gate insulating film is controlled by utilizing the orientation of a substrate, a substrate with a particular orientation is required, thereby increasing the manufacturing costs.

As shown in Patent Document 3, where the mask is formed on the sidewall surface of the trench to selectively form the thick gate insulating film on the portions other than the sidewall surface of the trench, the steps of forming and removing the mask are needed. This results in complicated manufacturing steps to increase the manufacturing costs and the cycle time.

The above-described problems occur in a silicon semiconductor device as well as in a semiconductor device made of wide bandgap semiconductor such as silicon carbide (SiC). In particular, the dielectric constant of SiC (e.g., 9.7 of 4H—SiC) is smaller than the dielectric constant (11.9) of Si and is less different from the dielectric constant (3.8) of $SiO_2$. Thus, a high electric field is applied to a gate insulating film in a semiconductor device made of SiC. As a result, where a gate electrode has a T-shape in a semiconductor device made of SiC, the problems such as an increase in the gate-semiconductor layer capacitance and a decrease in the breakdown voltage of the gate insulating film between the gate and the semiconductor layer become more serious.

In view of the problems, easily providing a semiconductor device having a trench gate structure, which reduces gate-semiconductor layer capacitance and increases the breakdown voltage of a gate insulating film between a gate and a semiconductor layer will be described below.

Solution to the Problem

A semiconductor device according to an aspect disclosed in the present specification includes a substrate having a semiconductor layer on a principal surface thereof; a trench provided in the semiconductor layer; a first first-conductivity-type impurity region provided in an upper portion of the semiconductor layer around the trench; a gate insulating film provided on a sidewall surface of the trench and on the portion of the semiconductor layer around the trench; and a gate electrode provided on a portion of the gate insulating film inside the trench, and on the gate insulating film on the portion of the semiconductor layer around the trench. A second-conductivity-type impurity region and a second first-conductivity-type impurity region are interposed between a portion of the gate electrode around the trench and the first first-conductivity-type impurity region sequentially above the first first-conductivity-type impurity region.

A method of manufacturing a semiconductor device according to an aspect disclosed in the present specification includes preparing a substrate having a semiconductor layer on a principal surface thereof; forming a first first-conductivity-type impurity region in an upper portion of the semiconductor layer; forming a second-conductivity-type impurity region on the first first-conductivity-type impurity region; forming a second first-conductivity-type impurity region on the second-conductivity-type impurity region; forming a trench in the semiconductor layer; forming a gate insulating film on a sidewall surface of the trench and on a portion of the semiconductor layer around the trench; and forming a gate electrode on a portion of the gate insulating film inside the trench, and on the gate insulating film on the portion of the semiconductor layer around the trench. The second-conductivity-type impurity region and the second first-conductivity-type impurity region are interposed between a portion of the gate electrode around the trench and the first first-conductivity-type impurity region.

Advantages of the Disclosure

In the semiconductor device and the method of manufacturing the device disclosed in this specification, the parasitic capacitance between the gate and the semiconductor layer is easily reduced, and the breakdown voltage of the gate insulating film between the gate and the semiconductor layer is easily increased.

BRIEF DESCRIPTION OF THE DRAWINGS

FIG. 1 is a top view illustrating a semiconductor device according to a first embodiment.

FIG. 2 is a cross-sectional view illustrating the semiconductor device according to the first embodiment.

FIGS. 3(a)-3(d) are cross-sectional views illustrating steps of a method of manufacturing the semiconductor device according to the first embodiment.

FIGS. 4(a)-4(d) are cross-sectional views illustrating steps of the method of manufacturing the semiconductor device according to the first embodiment.

FIG. 5 is a cross-sectional view illustrating a semiconductor device according to a first variation of the first embodiment.

FIG. 6 is a cross-sectional view illustrating a semiconductor device according to a second variation of the first embodiment.

FIG. 7 is a cross-sectional view illustrating a semiconductor device according to a second embodiment.

FIGS. 8(a)-8(d) are cross-sectional views illustrating steps of a method of manufacturing the semiconductor device according to the second embodiment.

FIGS. 9(a)-9(d) are cross-sectional views illustrating steps of the method of manufacturing the semiconductor device according to the second embodiment.

FIG. 10 is a cross-sectional view illustrating a semiconductor device according to a third embodiment.

FIGS. 11(a)-11(d) are cross-sectional views illustrating steps of a method of manufacturing the semiconductor device according to the third embodiment.

FIG. 12 is a cross-sectional view illustrating a semiconductor device according to a fourth embodiment.

FIGS. 13(a)-13(c) are cross-sectional views illustrating variations of the semiconductor device according to the fourth embodiment.

FIGS. 14(a)-14(c) are cross-sectional views illustrating steps of a method of manufacturing the semiconductor device according to the fourth embodiment.

FIG. 15 is a cross-sectional view illustrating a semiconductor device according to a fifth embodiment.

FIGS. 16(a)-16(d) are cross-sectional views illustrating steps of a method of manufacturing the semiconductor device according to the fifth embodiment.

FIGS. 17(a)-17(d) are cross-sectional views illustrating steps of the method of manufacturing the semiconductor device according to the fifth embodiment.

FIG. 18 is a cross-sectional view illustrating a semiconductor device according to a variation of the fifth embodiment.

FIG. 19 is a cross-sectional view illustrating a semiconductor device according to a sixth embodiment.

FIGS. 20(a)-20(d) are cross-sectional views illustrating steps of a method of manufacturing the semiconductor device according to the sixth embodiment.

FIGS. 21(a)-21(d) are cross-sectional views illustrating steps of the method of manufacturing the semiconductor device according to the sixth embodiment.

FIG. 22 is a cross-sectional view illustrating a step of the method of manufacturing the semiconductor device according to the sixth embodiment.

FIG. 23 is a cross-sectional view illustrating a semiconductor device according to a seventh embodiment.

FIGS. 24(a)-24(d) are cross-sectional views illustrating steps of a method of manufacturing the semiconductor device according to the seventh embodiment.

FIG. 25 is a cross-sectional view illustrating a semiconductor device according to an eighth embodiment.

FIGS. 26(a)-26(c) are cross-sectional views illustrating steps of a method of manufacturing the semiconductor device according to the eighth embodiment.

DESCRIPTION OF EMBODIMENTS

Figure 1:
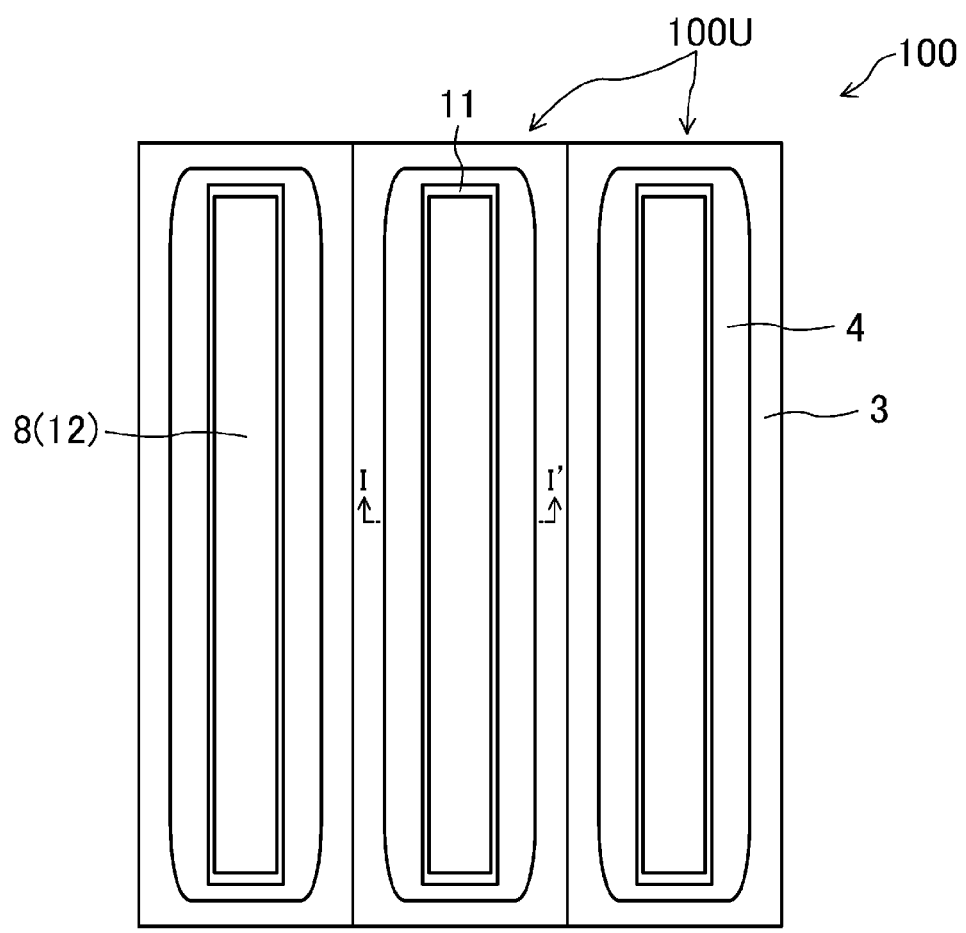
[FIG. 1]

In a semiconductor device disclosed in the present specification and having a trench gate structure, for example, a first first-conductivity-type impurity region, which is a source region, a second-conductivity-type impurity region, and a second first-conductivity-type impurity region are sequentially stacked one on the top of the other under a gate electrode extending on the semiconductor layer around the trench.

In this semiconductor device, the second-conductivity-type impurity region and the second first-conductivity-type impurity region are interposed between the gate electrode extending on the semiconductor layer around the trench and the first first-conductivity-type impurity region (e.g., the source region or an emitter region). Thus, a depletion layer formed between the second first-conductivity-type impurity region and the second-conductivity-type impurity region, and a depletion layer formed between the second-conductivitytype impurity region and the first first-conductivity-type impurity region function as capacitors under the gate electrode extending on the semiconductor layer around the trench in addition to the gate insulating film. This reduces the gate electrode-semiconductor layer capacitance as compared to the case where the second-conductivity-type impurity region and the second first-conductivity-type impurity region are not provided. Since the voltage between the gate electrode and the semiconductor layer is distributed to the gate insulating film and the two depletion layers, the strength of the electric field applied to the gate insulating film can be reduced, thereby increasing the breakdown field strength of the gate insulating film.

This advantage of increasing the breakdown voltage is provided regardless of whether the bias voltage applied to the gate electrode is positive or negative, since an NPN or PNP structure is formed by stacking three regions of the first first-conductivity-type impurity region, the second-conductivity-type impurity region, and the second first-conductivity-type impurity region.

For example, where the first conductivity type is the n type, and the second conductivity type is the p type, the three regions form an NPN structure. In this case, when a negative bias voltage is applied to the gate electrode, the depletion layer between the first first-conductivity-type impurity region and the second-conductivity-type impurity region increases the breakdown voltage. When a positive bias voltage is applied to the gate electrode, the depletion layer between the second-conductivity-type impurity region and the second first-conductivity-type impurity region increases the breakdown voltage. As such, the breakdown voltage increases regardless of where the bias voltage is positive or negative.

By contrast, if the second first-conductivity-type impurity region is not provided and if the conductivity types are the same as above, an NP structure is formed only by the first first-conductivity-type impurity region and the second-conductivity-type impurity region. In this case, when a negative bias voltage is applied to the gate electrode, the depletion layer between the first first-conductivity-type impurity region and the second-conductivity-type impurity region increases the breakdown voltage. However, when a positive bias voltage is applied, the advantage of increasing the breakdown voltage is not provided, since there is no corresponding depletion layer. Where the conductivity types are opposite, the breakdown voltage increases only when a negative bias voltage is applied, for a similar reason.

How the present inventors have thought of the semiconductor device disclosed in the present specification and having a trench gate structure will be described below.

In a semiconductor device having a trench gate structure, a voltage of, for example, about ±20 V is applied to a gate electrode. At this time, the voltage of a source is almost 0 V, and thus the voltage of about ±20 V is applied between the gate electrode and a semiconductor layer (e.g., a source region). A conventional thermal oxide film has a breakdown field strength of 10 MV/cm or more. However, in order to secure the reliability of the gate insulating film in long-term use, the electric field strength acceptable in a semiconductor device is preferably sufficiently smaller than the breakdown field strength, for example, from about 3 MV/cm to about 4 MV/cm.

For example, the gate insulating film has a thickness of about 70 nm on the sidewall of a trench. Where a SiC semiconductor substrate having the (0001) Si plane as the principal surface is used, and where the gate insulating film has a thickness of about 70 nm on the (11-20) plane, which is the sidewall surface close to the trench, the gate insulating film has a thickness of about 30 nm or less on the (0001) Si plane, which is the semiconductor principal surface around the trench (where the gate insulating film is formed by thermal oxidation). Thus, the electric field applied to the gate insulating film on the semiconductor principal surface is about 10 MV/cm or more, thereby providing an insufficiently reliable gate insulating film. In addition, the capacitance between the gate electrode and the semiconductor layer becomes about four times the capacitance in the case where the gate insulating film is formed so that the sidewall has the same thickness as the principal surface of the semiconductor layer. The increase in the capacitance causes a delay to reduce the switching speed.

The formation of the gate insulating film can be divided into a plurality of steps to selectively increase the thickness of the gate insulating film on the portion of the semiconductor layer around the trench, thereby controlling the thickness of the gate insulating film on the sidewall surface of the trench independently from the thickness of the gate insulating film on the portion of the semiconductor layer around the trench. However, where the formation of the gate insulating film is divided into the plurality of steps, an increase in the number of the steps is problematic. The gate insulating film is formed by the plurality of steps, for example, as follows. First, a thermal oxide film is formed inside and around the trench, and then a polysilicon film is formed to cover the thermal oxide film. Next, a nitride film for covering the polysilicon film is formed, and the formed nitride film is selectively removed to form a mask covering the sidewall surface of the trench and exposing the bottom of the trench. The portion of the polysilicon film exposed from the mask is thermally oxidized, and then the mask is removed. In addition, the unoxidized polysilicon film is removed.

The above-described formation of the gate insulating film by the plurality of steps has other problems as follows. Specifically, the oxide film obtained by oxidizing polysilicon has smaller breakdown field strength than an oxide film obtained by oxidizing single crystal silicon. Since the thickness of the gate insulating film on the portion of the semiconductor layer around the trench needs to be greater than that in the case where a thermal oxide film, which will be a gate insulating film, is directly formed inside and around the trench, the polysilicon film, which will be a gate insulating film, needs to be thick. However, it is difficult to completely oxidize such a thick polysilicon film into the inside, and thus, it is not easy to form the thickness of the gate insulating film on the portion of the semiconductor layer around the trench much greater than the thickness of the gate insulating film on the sidewall surface of the trench.

Therefore, the present inventors have thought of the semiconductor device formed by sequentially stacking, for example, a first first-conductivity-type impurity region, which is a source region, a second-conductivity-type impurity region, and a second first-conductivity-type impurity region under a gate electrode extending on the semiconductor layer around the trench to reduce the capacitance between the portion of the gate electrode around the trench and the semiconductor layer, and to increase the breakdown voltage of the gate insulating film without changing the thickness of the gate insulating film on the sidewall surface of the trench and on the portion of the semiconductor layer around the trench.

First Embodiment

A semiconductor device and a method of manufacturing the device according to a first embodiment will be described hereinafter with reference to the drawings.

Figure 2:
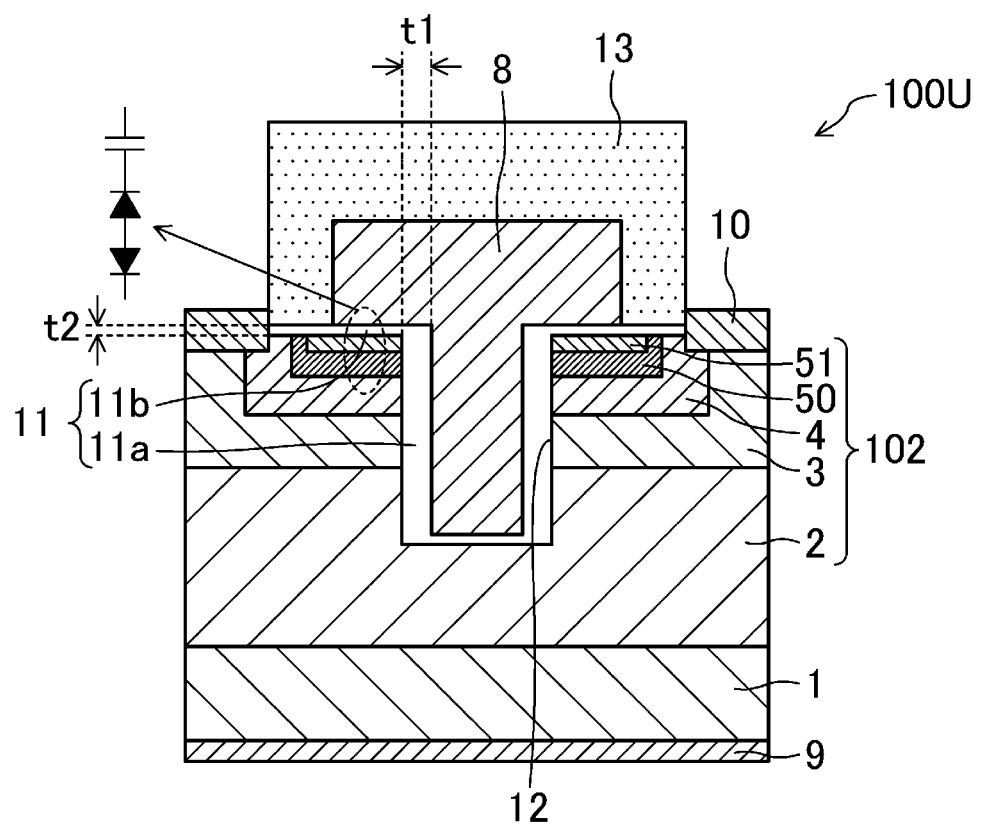
[FIG. 2]

FIGS. 1 and 2 illustrate the structure as viewed from above and the cross-sectional structure of the example semiconductor device according to the first embodiment. For simplicity, FIG. 1 shows no source electrode, etc. and only the portions of a gate electrode 8 and a gate insulating film 11 which are formed inside a trench 12. FIG. 2 is cross-sectional view taken along the line I-I' of FIG. 1.

A semiconductor device 100 of this embodiment is a SiC-metal insulator semiconductor field effect transistor (MIS-FET) having a trench gate structure, and includes a plurality of unit cells 100U as shown in FIG. 1. In this embodiment, as shown in FIG. 1, the trench 12 has a (striped) rectangular plane as viewed from the normal direction of the principal surface of a substrate. FIG. 2 is a cross-sectional view of the semiconductor device in the direction orthogonal to the longitudinal direction of the trench. Note that the trench 12 may have other planar shapes, and a cross-section in other directions may be considered.

As shown in FIG. 2, each of the unit cells 100U includes a semiconductor layer 102 provided on a front surface (i.e., a principal surface) of a substrate 1 containing SiC. The semiconductor layer 102 includes an n-type drift region 2, a p-type body region 3 provided on the drift region 2, and an n-type source region 4 provided in the upper portion of the body region 3. The source region 4 is surrounded by the body region 3.

In this embodiment, a p-type impurity region 50 is surrounded by the source region 4 in the upper portion of the source region 4, and an n-type impurity region 51 is surrounded by the p-type impurity region 50 in the upper portion of the p-type impurity region 50. In this embodiment, the source region 4 corresponds to a "first first-conductivity-type impurity region," the p-type impurity region 50 corresponds to a "second-conductivity-type impurity region," and the n-type impurity region 51 corresponds to a "second first-conductivity-type impurity region."

The p-type impurity region 50 has an impurity concentration of, for example, about $2 \times 10^{18}$ cm$^{-3}$, the p-type impurity region 50 has a depth (i.e., the depth from the upper surface of the semiconductor layer 102) of, for example, about 100 nm, the n-type impurity region 51 has an impurity concentration of, for example, about $2 \times 10^{18}$ cm$^{-3}$, and the n-type impurity region 51 has a depth (i.e., the depth from the upper surface of the semiconductor layer 102) of, for example, about 50 nm. As a result, depletion layers with a width of about 40 nm are formed between the n-type impurity region 51 and the p-type impurity region 51, and between the p-type impurity region 50 and the source region 4. The concentration and formation depth of the p-type impurity region 50 and the n-type impurity region 51 are not limited to the above-described examples, and may be set to a preferable combination providing a required width of the depletion layers.

As shown in FIG. 2, the semiconductor layer 102 includes the trench (i.e., a recess) 12, which penetrates the n-type impurity region 51, the p-type impurity region 50, the source region 4, and the body region 3, and reaches the drift region 2. A gate insulating film 11 is formed on the bottom and the sidewall surface of the trench 12, and on the semiconductor layer 102 around the trench 12. The gate insulating film 11 includes a first insulating film 11a provided on the sidewall surface of the trench 12, and a second insulating film 11b provided around the trench 12. In this embodiment, a thickness t1 of the first insulating film 11a is greater than and equal to a thickness t2 of the second insulating film 11b.

The gate electrode 8 made of a conductive film is formed on the gate insulating film 11 to fill the trench 12, and expand on the semiconductor layer 102 around the trench 12. Thus, the gate electrode 8 has a T-shaped cross-section. The side surface of the portion of the gate electrode 8 buried in the trench 12 is in contact with the first insulating film 11a, and the portion of the gate electrode 8 provided around the trench 12 is in contact with the second insulating film 11b. As such, the gate electrode 8 is electrically insulated from the semiconductor layer 102 by the gate insulating film 11.

Where the portion of the gate electrode 8 expanding around the trench 12 overlaps the n-type impurity region 51 even a little, a depletion layer can be formed below the overlapping region, thereby obtaining advantages. However, the entire portion of the gate electrode 8 expanding around the trench 12 preferably overlaps the n-type impurity region 51, in other words, the width of the gate electrode 8 at the portion expanding around the trench 12 is preferably smaller than the width of the n-type impurity region 51 in the direction along the upper surface of the semiconductor layer 102. As a result, the depletion layer is formed across the entire region below the portion of the gate electrode 8 expanding around the trench 12, thereby exhibiting the above-described advantages more significantly.

As shown in FIG. 2, a source electrode (i.e., a source-body electrode) 10, which is electrically coupled to the source region 4 and the body region 3, is provided on the semiconductor layer 102. In this embodiment, the source electrode 10 surrounds the trench 12. The source electrode 10 is provided outside the p-type impurity region 50 as viewed from the trench 12, and is electrically insulated from the p-type impurity region 50 and the n-type impurity region 51. A drain electrode 9 is provided on the back surface (i.e., the surface opposite to the principal surface) of the substrate 1. In addition, an interlayer insulating film 13 covering the gate electrode 8 is provided on the semiconductor layer 102. Although not shown, the interlayer insulating film 13 includes a gate interconnect and a source interconnect, and the gate interconnect and the source interconnect are electrically coupled to the gate electrode 8 and the source electrode 10 via contact plugs.

FIGS. 3(a)-3(d) and 4(a)-4(d) are cross-sectional views illustrating steps of a method of manufacturing the example semiconductor device according to the first embodiment.

Figure 3:
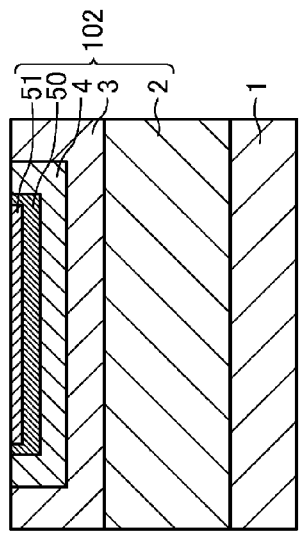
[FIG. 3]
Figure 3:
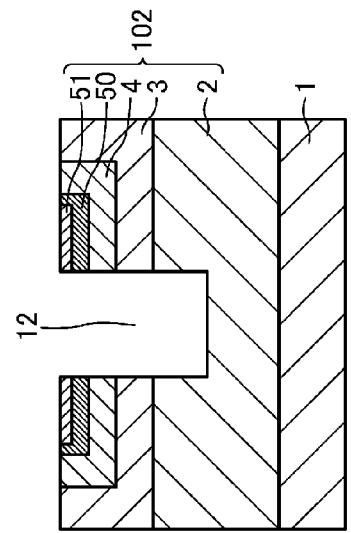
Figure 3:
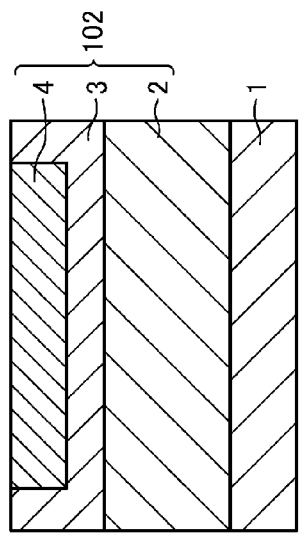
Figure 3:
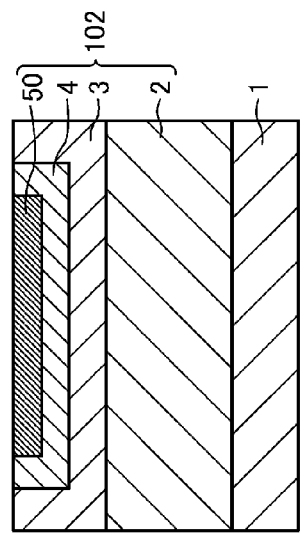

First, as shown in FIG. 3(a), for example, a SiC layer is epitaxially grown on the principal surface of the substrate 1, thereby sequentially forming the n-type drift region 2 and the p-type body region 3. Then, the n-type source region 4 is formed in the upper portion of the body region 3, for example, by ion implantation.

The substrate 1 may be an n-type low-resistance SiC substrate containing nitrogen at a concentration of, for example, about $3 \times 10^{18}$ cm$^{-3}$. The drift region 2 may be doped with nitrogen at a concentration of, for example, about $8 \times 10^{15}$ cm$^{-3}$. The drift region 2 may have a thickness of, for example, about 12 μm. The impurity concentration and the thickness of the drift region 2 may be determined by the required breakdown voltage, and are not limited to the described concentration and thickness.

The body region 3 may be doped with aluminum at a concentration of, for example, about $2 \times 10^{18}$ cm$^{-3}$. The body region 3 may have a thickness of, for example, about 1 μm.

The source region 4 may be formed, for example, by ion implantation, etc. The source region 4 may have an impurity concentration of, for example, about $5 \times 10^{19}$ cm$^{-3}$, and the source region 4 may have a depth (i.e., the depth from the upper surface of the semiconductor layer 102) of, for example, about 500 nm. The method of forming the source region 4 by ion implantation is as follows. First, an implantation mask made of, for example, SiO$_2$ etc. is formed to expose the portion of the body region 3, in which the source region 4 is formed. After that, n-type impurity ions (e.g., nitrogen ions) are implanted into the body region 3. The ion implantation may be performed gradually with the combination of the acceleration energy and the dose of, for example, (30 keV and $2\times10^{14}$ cm$^{-2}$), (55 keV and $2\times10^{14}$ cm$^{-2}$), and (90 keV and $5\times10^{14}$ cm$^{-2}$).

While in this embodiment, an example has been described where the semiconductor layer 102 including the drift region 2, the body region 3, and the source region 4 is formed by epitaxial growth, all or part of the semiconductor layer 102 may be formed by ion implantation, etc. on the SiC substrate. For example, p-type type impurities may be implanted into an n-type SiC substrate, and the upper portion of the SiC substrate may be the body region 3. After an n-type semiconductor layer is epitaxially grown on the SiC substrate, p-type impurities may be ion-implanted into the upper portion of the formed n-type semiconductor layer to form the body region 3. In these cases, the region not doped with the p-type impurities is the drift region 2.

Then, as shown in FIG. 3(b), the p-type impurity region 50 is formed in the source region 4, for example, by ion implantation. The p-type impurity region 50 may have an impurity concentration of, for example, about $2\times10^{18}$ cm$^{-3}$, and the p-type impurity region 50 may have a depth of, for example, about 100 nm. A specific formation method of the p-type impurity region 50 is, for example, as follows. First, for example, an implantation mask made of SiO$_2$, etc. is formed to expose the portion of the source region 4, in which the p-type impurity region 50 is formed. After that, p-type impurity ions (e.g., aluminum ions) are implanted into the source region 4. The ion implantation may be performed gradually with the combination of the acceleration energy and the dose of, for example, (30 keV and $6\times10^{12}$ cm$^{-2}$), (70 keV and $1\times10^{13}$ cm$^{-2}$), and (150 keV and $2.5\times10^{13}$ cm$^{-2}$). Then, the implantation mask is removed.

Next, as shown in FIG. 3(c), the n-type impurity region 51 is formed in the p-type impurity region 50, for example, by ion implantation. The n-type impurity region 51 may have an impurity concentration of, for example, about $2\times10^{18}$ cm$^{-3}$, and the n-type impurity region 51 may have a depth of, for example, about 50 nm. A specific formation method of the n-type impurity region 51 is, for example, as follows. First, for example, an implantation mask made of SiO$_2$, etc. is formed to expose the portion of the p-type impurity region 50, in which the n-type impurity region 51 is formed. After that, the n-type impurity ions (e.g., nitrogen ions) are implanted into the source region 4. The ion implantation may be performed gradually with the combination of the acceleration energy and the dose of, for example, (30 keV and $6\times10^{12}$ cm$^{-2}$) and (70 keV and $1\times10^{13}$ cm$^{-2}$). Then, the implantation mask is removed.

After the formation of the n-type impurity region 51, annealing is performed, for example, under an inert gas atmosphere at a temperature of about 1700° C. for about 30 minutes. This activates the impurity ions implanted into the source region 4, the p-type impurity region 50, and the n-type impurity region 51.

Then, as shown in FIG. 3(d), the trench 12 is formed in the semiconductor layer 102. A specific formation method of the trench 12 is, for example, as follows. First, a mask made of, for example, a SiO$_2$ film is formed to expose the center of the n-type impurity region 51 (positioned above the centers of the source region 4 and the p-type impurity region 50). After that, part of the n-type impurity region 51, the p-type impurity region 50, the source region 4, the body region 3, and the drift region 2 are sequentially removed by reactive ion etching (RIE) using the mask. The trench 12 is formed not to penetrate the drift region 2, and so that the bottom is lower than the interface between the drift region 2 and the body region 3. The trench 12 may have a depth of, for example, about 1.5 μm, and the trench may have a width of, for example, about 1 μm.

While in this embodiment, as shown in FIG. 3(d), an example has been described where the sidewall surface of the trench 12 is perpendicular to the principal surface of the substrate 1, the sidewall surface of the trench 12 may not be perpendicular to the principal surface of the substrate 1.

Figure 4:
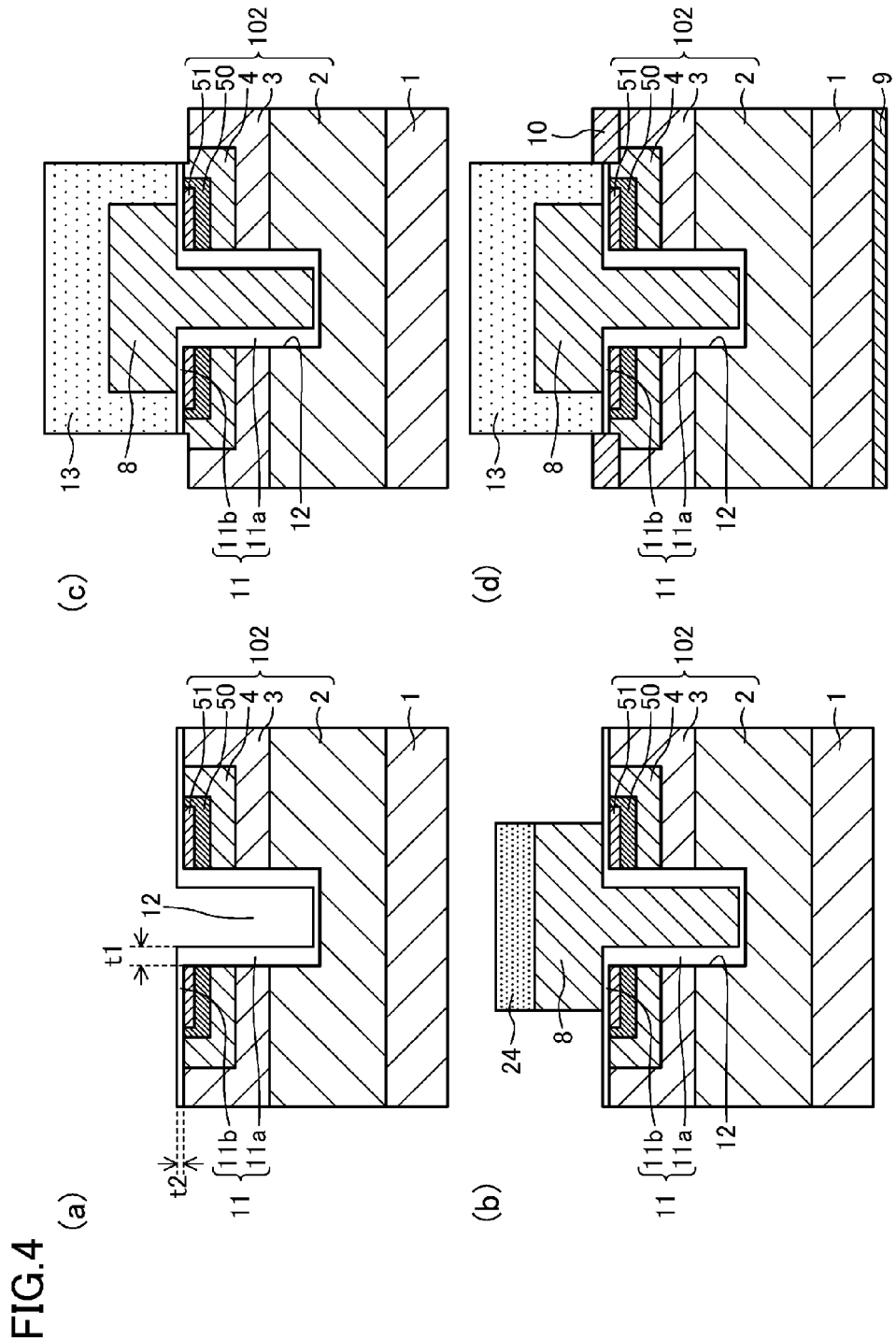
[FIG. 4]

Next, as shown in FIG. 4(a), an oxide film is formed as the gate insulating film 11, for example, by thermal oxidation on the bottom and the sidewall surface of the trench 12, and on the semiconductor layer 102 around the trench 12. Specifically, as the thermal oxidation, thermal treatment is performed, for example, under a dry oxidation atmosphere at a temperature of about 1200° C. for about one hour, thereby forming as part of the gate insulating film 11, the first insulating film 11a with the thickness t1 of, for example, about 70 nm on the (11-20) plane which is the sidewall surface of the trench 12. At this time, the second insulating film 11b with the thickness t2 of, for example, about 30 nm is formed on the (0001) Si plane which is the upper surface of the semiconductor layer 102 around the trench 12.

After that, as shown in FIG. 4(b), a conductive film is formed on the entire surface of the semiconductor layer 102 including the inside of the trench 12, and then, the conductive film is etched by RIE using the photoresist 24 as a mask. As a result, the T-shaped gate electrode 8 is formed on the gate insulating film 11 to fill the trench 12 and expand on the semiconductor layer 102 around the trench 12. The conductive film may be, for example, a polysilicon film having a thickness of about 600 nm and doped with phosphorus at a concentration of $1\times10^{20}$ cm$^{-3}$ or more. The polysilicon film may be formed, for example, by low pressure chemical vapor deposition (LP-CVD). The conductive film for forming the gate electrode 8 may be a conductive film other than a polysilicon film.

In this embodiment, the gate electrode 8 is formed so that the entire portion of the gate electrode 8 expanding around the trench 12 overlaps the n-type impurity region 51. As a result, the multilayer of the source region 4, the p-type impurity region 50, and the n-type impurity region 51 is provided across the entire region below the gate electrode 8 around the trench 12.

The gate electrode 8 preferably has a width of, for example, about 200 nm or more at the portion expanding around the trench 12 (i.e., the width in the direction along the upper surface of the semiconductor layer 102) in view of misalignment in lithography, etc. On the other hand, the width is preferably, for example, about 500 nm or less for higher integration of the elements.

After the photoresist 24 is removed, as shown in FIG. 4(c), the interlayer insulating film 13 is formed to cover the gate electrode 8, and then, an opening is formed in the interlayer insulating film 13, for example, by RIE using a resist mask (not shown) exposing part of the source region 4 and the body region 3. In order to reliably electrically insulate the p-type impurity region 50 from the source electrode 10 (see FIG. 4(d)), which will be described later, the opening of the interlayer insulating film 13 is formed outside the p-type impurity region 50. At this time, the portion of the gate insulating film 11 in the opening of the interlayer insulating film 13 is also removed.

Then, as shown in FIG. 4(d), a conductive film is deposited on the portion of the semiconductor layer 102 in the opening of the interlayer insulating film 13 to perform thermal treatment, thereby forming a source electrode (i.e., a source-body electrode) 10 electrically coupled to the source region 4 and the body region 3. The conductive film for forming the source electrode 10 may be, for example, made nickel (Ni), etc. A specific formation method of the source electrode 10 is, for example, as follows. First, after the conductive film for forming the source electrode 10 is deposited, thermal treatment is performed, for example, under a nitrogen atmosphere at a temperature of about 950° C. for about one minute. After that, an unreacted conductive film is removed with, for example, a hydrogen peroxide solution. As a result, the source electrode 10 is obtained, which is in ohmic contact with the source region 4 and the body region 3.

Next, as shown in FIG. 4(d), the drain electrode 9 is formed on the back surface (i.e., the surface opposite to the principal surface) of the substrate 1, for example, by a method similar to the formation of the source electrode 10. After that, although not shown, the gate interconnect, the source interconnect, the contact plugs, which electrically couple the interconnects to the gate electrode 8 and the source electrode 10, etc., may be formed in the interlayer insulating film 13 as appropriate.

Assume that the substrate 1 is made of SiC, the principal surface of the substrate 1 is the (0001) Si plane, on which crystal growth is easily performed, and the thickness of the gate insulating film 11 on the sidewall surface of the trench 12 is set to, for example, about 70 nm. Then, since the (0001) Si plane is oxidized at extremely low speed, a $SiO_2$ film, which is formed on the upper surface of the semiconductor layer 102 by thermal oxidation, has a thickness of about 30 nm. Therefore, where the gate electrode 8 has a T-shaped cross-section, the gate electrode 8 is too close to the source region 4, thereby increasing the gate-source capacitance.

On the other hand, in this embodiment, as shown in FIG. 2, the source region 4, the p-type impurity region 50, and the n-type impurity region 51 are stacked below the portion of the T-shaped gate electrode 8 formed on the upper surface of the semiconductor layer 102 around the trench 12, a pn junction occurs between each pair of the regions to form a depletion layer. As a result, in addition to the gate insulating film 11, the depletion layers formed between the regions perform the same function as an insulating film. This reduces the parasitic capacitance between the gate electrode 8 and the source region 4, as compared to the case where only the gate insulating film 11 is provided between the gate electrode 8 and the source region 4 (i.e., where the p-type impurity region 50 and the n-type impurity region 51 of this embodiment are not provided). Since a voltage between the gate electrode 8 and the source region 4 is separately applied to the gate insulating film 11 and the depletion layers, the strength of the electric field applied to the gate insulating film 11 can be reduced, thereby increasing the breakdown field strength of the gate insulating film 11. FIG. 2 also illustrates an equivalent circuit having the multilayer of the source region 4, the p-type impurity region 50, the n-type impurity region 51, the gate insulating film 11, and the gate electrode 8. The impurity concentration and the thickness of the p-type impurity region 50 and the n-type impurity region 51 can be set by calculation to form the depletion layers with a width corresponding to the applied voltage. In other words, the width of the depletion layers is determined by the impurity concentration and the thickness of the p-type impurity region 50 and the n-type impurity region 51. Where the impurity concentration of the p-type impurity region 50 and the n-type impurity region 51 is determined so that the depletion layers, for example, between the source region 4 and the p-type impurity region 50, and between the p-type impurity region 50 and the n-type impurity region 51 have a width of 40 nm, and the dielectric constant of the depletion layers is converted to an oxide film, advantages similar to the case where an insulating film with a thickness of about 40 nm are provided. In this case, in addition to the thickness 30 nm of the insulating film formed on the (0001) Si plane by thermal oxidation as described above, an insulating film a thickness about 70 nm in total is formed. As such, the thickness of the gate insulating film 11 is increased about 2.3 times, thereby reducing the gate-source capacitance to about 40% of the original value.

Since a voltage between the gate electrode 8 around the trench 12 and the source region 4 is separately applied to the gate insulating film 11 around the trench 12 (with a thickness about 30 nm) and the depletion layers (with a thickness of about 40 nm in the oxide film conversion), the electric field strength of the gate insulating film 11 around the trench 12 can be reduced to a value of about 3 MV/cm.

As above-described, this embodiment mitigates an increase in the gate-source capacitance, increases the breakdown voltage of the gate insulating film 11, and increases the cross-sectional area of the gate electrode 8, thereby easily mitigating an increase in the gate resistance. This advantage is provided regardless of whether the bias voltage applied to the gate electrode 8 is positive or negative.

Figure 5:
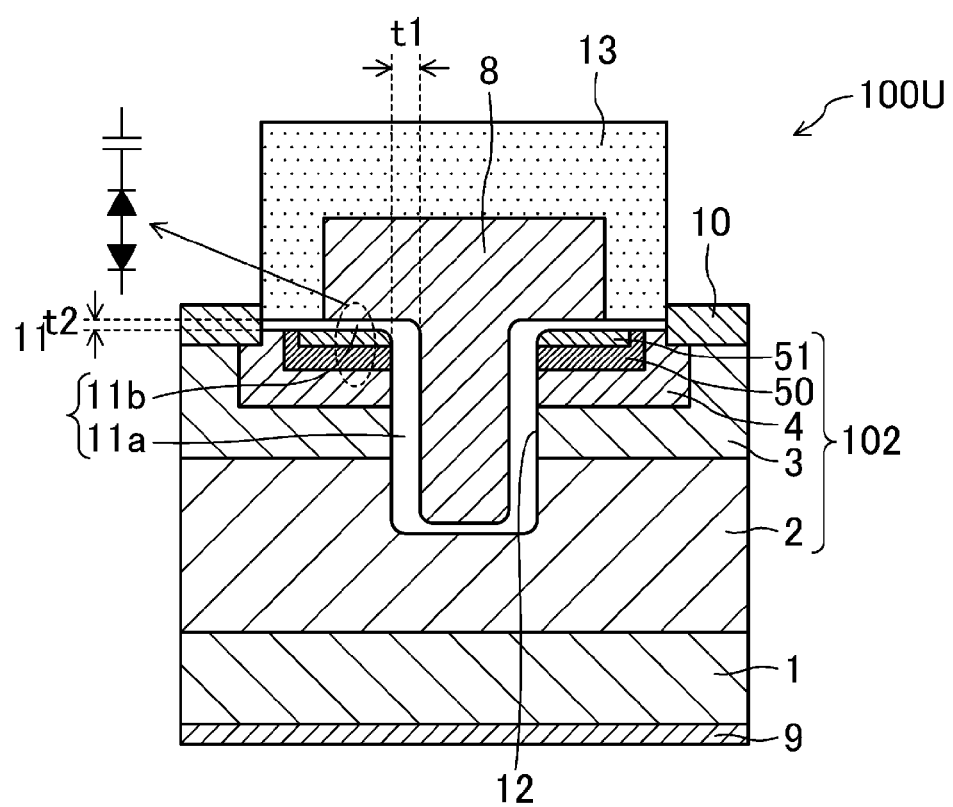
[FIG. 5]

FIG. 2 illustrates the example where the upper corner of the trench 12 has almost a right angle. However, as shown in FIG. 5, the upper corner of the trench 12 may be rounded to be a curbed corner. FIG. 5 is a cross-sectional view illustrating a semiconductor device according to a first variation of this embodiment. By rounding the upper corner of the trench 12, the electric field concentration at the upper corner of the trench 12 is reduced.

The semiconductor device according to the first variation shown in FIG. 5 can be obtained as follows. Specifically, in the etching for forming the trench 12, the etching starts under the conditions that the amount of a product deposited during the etching increases, and then the etching is performed under the conditions that the amount of the product deposited during the etching gradually decreases, thereby rounding the upper corner of the trench 12. Alternatively, the trench 12 having a vertical upper corner may be formed under conventional etching conditions, and then annealing may be performed under a hydrogen atmosphere to round the upper corner of the trench 12. As shown in FIG. 5, not only the upper corner of the trench 12, but also the lower corner may be a curbed corner. This reduces the electric field concentration at the lower corner of the trench 12.

Figure 6:
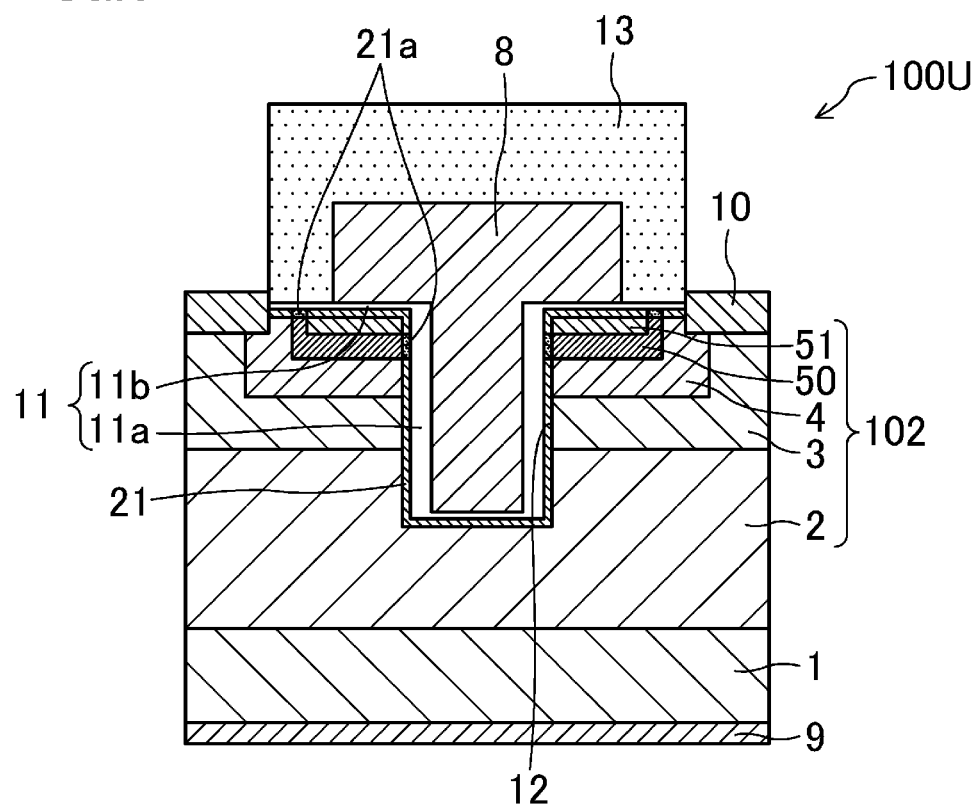
[FIG. 6]

While in this embodiment, a MISFET having an inversion channel structure has been described, a MISFET having an accumulation channel structure as shown in FIG. 6 may have a structure similar to that in this embodiment. FIG. 6 is a cross-sectional view illustrating a semiconductor device according to a second variation of this embodiment. In the second variation, for example, after the trench 12 is formed in the semiconductor layer 102, a channel layer (hereinafter referred to as an n-type channel layer) 21 made of an n-type SiC layer on the semiconductor layer 102 including the inside of the trench 12. After an n-type channel layer 21 is formed, similar to the MISFET of this embodiment having the inversion channel structure; the gate insulating film 11, the gate electrode 8, the source electrode 10, the drain electrode 9, etc., may be formed. In the second variation, the portion of the n-type channel layer 21, which is in contact with the p-type impurity region 50, may be completely depleted by a difference in concentration from the p-type impurity region 50 to form a depletion layer 21a, and thus, the n-type impurity region 51 is not electrically coupled to the source region 4 via the n-type channel layer 21.

Second Embodiment

An example semiconductor device and a method of manufacturing the device according to a second embodiment will be described hereinafter with reference to the drawings.

Figure 7:
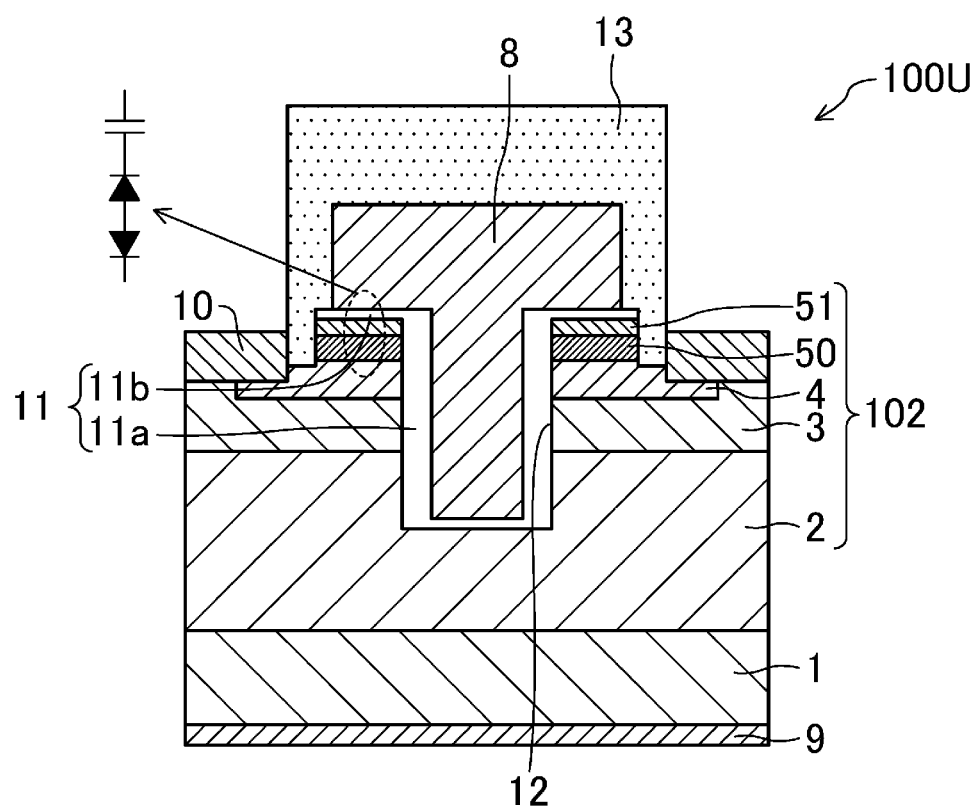
[FIG. 7]

FIG. 7 illustrates the cross-sectional structure of the semiconductor device according to the second embodiment.

The semiconductor device of this embodiment is a SiC-metal insulator semiconductor field effect transistor (MISFET) having a trench gate structure, and includes a plurality of unit cells 100U, similar to the structure of the semiconductor device according to the first embodiment shown in FIG. 1 as viewed from above. As shown in FIG. 7, each of the unit cells 100U includes a semiconductor layer 102 provided on a front surface (i.e., a principal surface) of a substrate 1 containing SiC. The semiconductor layer 102 includes an n-type drift region 2, a p-type body region 3 provided on the drift region 2, and an n-type source region 4 provided in the upper portion of the body region 3. The source region 4 is surrounded by the body region 3.

In this embodiment, a p-type impurity region 50 is formed on the source region 4, and an n-type impurity region 51 is formed on the p-type impurity region 50. The side surfaces (i.e., the side surfaces opposite to a trench 12, which will be described layer) of the p-type impurity region 50 and the n-type impurity region 51 are substantially flush (i.e., form a continuous plane), and the side surfaces are exposed from the source region 4.

In this embodiment, as shown in FIG. 7, the side surfaces of the p-type impurity region 50 and the n-type impurity region 51 are substantially perpendicular to the principal surface of the substrate 1. However, the surfaces of the p-type impurity region 50 and the n-type impurity region 51 may be inclined from the principal surface of the substrate 1 at an angle other than 90°, and the surfaces may have curvature.

The impurity concentration and the depth of the p-type impurity region 50 and the n-type impurity region 51 may be determined, for example, similarly to the first embodiment.

The trench 12, the gate insulating film 11, and the gate electrode 8 may have structures similar to those in, for example, the first embodiment.

Where the portion of the gate electrode 8 expanding around the trench 12 overlaps the n-type impurity region 51 even a little, a depletion layer can be formed below the overlapping region, thereby obtaining advantages. However, the entire portion of the gate electrode 8 expanding around the trench 12 preferably overlaps the n-type impurity region 51, in other words, the width of the gate electrode 8 at the portion expanding around the trench 12 is preferably smaller than the width of the n-type impurity region 51 in the direction along the principal surface of the semiconductor layer 102. As a result, the depletion layer is formed across the entire region below the portion of the gate electrode 8 expanding around the trench 12, thereby exhibiting the above-described advantages more significantly.

As shown in FIG. 7, a source electrode (i.e., a source-body electrode) 10, which is electrically coupled to the source region 4 and the body region 3, is provided on the semiconductor layer 102. In this embodiment, the source electrode 10 surrounds the trench 12. The source electrode 10 is provided outside the p-type impurity region 50 as viewed from the trench 12. In addition, an interlayer insulating film 13 covering the gate electrode 8 is provided on the semiconductor layer 102. An opening exposing the source electrode 10 is provided in the interlayer insulating film 13, and the interlayer insulating film 13 covers the side surfaces of the p-type impurity region 50 and the n-type impurity region 51 opposite to the trench 12. As a result, the source electrode 10 is electrically insulated from the p-type impurity region 50 and the n-type impurity region 51.

The drain electrode 9, a gate interconnect, a source interconnect, etc., may have structures similar to those in, for example, the first embodiment.

FIG. 7 also illustrates an equivalent circuit having the multilayer of the source region 4, the p-type impurity region 50, the n-type impurity region 51, the gate insulating film 11, and the gate electrode 8.

In the above-described first embodiment, the p-type impurity region 50 is exposed on the principal surface of the semiconductor layer 102 to electrically isolate the source region 4 from the n-type impurity region 51 (see FIG. 2). Thus, in the above-described semiconductor device according to the first embodiment, the planer size increases by the width of the exposed portion of the p-type impurity region 50.

On the other hand, in the second embodiment, the side surfaces of the p-type impurity region 50 and the n-type impurity region 51 opposite to the trench 12 are exposed from the source region 4, and covered by the interlayer insulating film 13, thereby electrically isolating the source region 4 from the n-type impurity region 51. Thus, different from the first embodiment, the exposed region of the p-type impurity region 50 is not required on the principal surface of the semiconductor layer 102, thereby reducing the chip area. This improves the mass productivity, and increases the filling rate of the unit cells 100U as compared in the same chip area so that a large current flows.

FIGS. 8(a)-8(d) and 9(a)-9(d) are cross-sectional views illustrating steps of a method of manufacturing the example semiconductor device according to the second embodiment.

First, similar to the step shown in FIG. 3(a) of the first embodiment, as shown in FIG. 8(a), for example, a SiC layer is epitaxially grown on the principal surface of the substrate 1, thereby sequentially forming the n-type drift region 2 and the p-type body region 3. Then, the n-type source region 4 is formed in the upper portion of the body region 3, for example, by ion implantation.

Then, annealing is performed, for example, under an inert gas atmosphere at a temperature of about 1700° C. for about 30 minutes. This activates impurity ions implanted into the source region 4.

Next, as shown in FIG. 8(b), the p-type impurity region 50 and the n-type impurity region 51 are formed on the principal surface of the semiconductor layer 102, for example, by epitaxial growth. The p-type impurity region 50 may have an impurity concentration of, for example, about $2 \times 10^{18}$ cm$^{-3}$, and the p-type impurity region 50 may have a depth of, for example, about 100 nm. The n-type impurity region 51 may have an impurity concentration of, for example, about $2 \times 10^{18}$ cm$^{-3}$, and the n-type impurity region 51 may have a depth of, for example, about 50 nm. The semiconductor layer 102 referred to in the following description includes the p-type impurity region 50 and the n-type impurity region 51.

While in this embodiment, an example has been described where the p-type impurity region 50 and the n-type impurity region 51 are formed by epitaxial growth, the p-type impurity region 50 and the n-type impurity region 51 may be formed by ion implantation. Where the ion implantation is used, the distribution of the implantation extends in the depth direction. Thus, the epitaxial growth is advantageous in forming a steep PN junction.

After that, as shown in FIG. 8(c), the trench 12 is formed in the semiconductor layer 102. A specific formation method of the trench 12 may be, for example, similar to that in the first embodiment. The trench 12 is formed not to penetrate the drift region 2, and so that the bottom is lower than the interface between the drift region 2 and the body region 3. The trench 12 may have a depth of, for example, about 1.5 μm, and the trench may have a width of, for example, about 1 μm.

While in this embodiment, as shown in FIG. 8(c), an example has been described where the sidewall surface of the trench 12 is perpendicular to the principal surface of the substrate 1, the sidewall surface of the trench 12 may not be perpendicular to the principal surface of the substrate 1.

Next, as shown in FIG. 8(d), an oxide film is formed as the gate insulating film 11, for example, by thermal oxidation on the bottom and the sidewall surface of the trench 12, and on the semiconductor layer 102 around the trench 12. Specifically, as the thermal oxidation, thermal treatment is performed, for example, under a dry oxidation atmosphere at a temperature of about 1200° C. for about one hour, thereby forming as part of the gate insulating film 11, the first insulating film 11a with the thickness t1 of, for example, about 70 nm on the (11-20) plane which is the sidewall surface of the trench 12. At this time, the second insulating film 11b with the thickness t2 of, for example, about 30 nm is formed on the (0001) Si plane which is the upper surface of the semiconductor layer 102 around the trench 12.

After that, as shown in FIG. 9(a), a conductive film is formed on the entire surface of the semiconductor layer 102 including the inside of the trench 12, and then, the conductive film is etched by RIE using the photoresist 24 as a mask. As a result, the T-shaped gate electrode 8 is formed on the gate insulating film 11 to fill the trench 12 and expand on the semiconductor layer 102 around the trench 12. A conductive film similar to that in the first embodiment may be used.

The gate electrode 8 preferably has a size sufficient to reduce the gate resistance at the portion expanding around the trench 12. The gate electrode 8 preferably has a width of, for example, about 200 nm or more at the portion expanding around the trench 12 (i.e., the width in the direction along the principal surface of the semiconductor layer 102) in view of misalignment in lithography, etc. On the other hand, the width is preferably, for example, about 500 nm or less for miniaturization of the elements.

Then, as shown in FIG. 9(b), the gate insulating film 11, the n-type impurity region 51, the p-type impurity region 50, the source region 4 (the surface portion), and the body region 3 (the surface portion) are removed, for example, by RIE using a photoresist 25 covering the gate electrode 8 and the semiconductor layer 102 around the gate electrode 8 (i.e., the photoresist 25 which is open above part of the source region 4 and the body region 3). Mixed gas containing a compound of fluorine (F) and carbon (C), and oxygen (O) is used in etching the gate insulating film 11. After that, the mixed gas is changed to, for example, chlorine (Cl) gas, thereby etching the n-type impurity region 51, the p-type impurity region 50, the source region 4 (the surface portion), and the body region 3 (the surface portion).

In this embodiment, the surface portion of the source region 4 is also removed partially. As long as the source region 4 can be electrically isolated from the n-type impurity region 51, and the p-type impurity region 50 and the n-type impurity region 51 can be electrically isolated from the source electrode 10 (see FIG. 9(d)), the etching shown in FIG. 9(b) may be ended at the surface of the source region 4. In view of variations in the step of etching, the etching preferably reaches the surface portion of the source region 4 to reliably remove the p-type impurity region 50 on the surface of the source region 4 and ensure electrical isolation of the p-type impurity region 50 from the source electrode 10.

In this embodiment, the n-type impurity region 51 is patterned so that the entire portion of the gate electrode 8 expanding around the trench 12 overlaps the n-type impurity region 51. As a result, the multilayer of the source region 4, the p-type impurity region 50, and the n-type impurity region 51 can be provided across the entire region below the gate electrode 8 around the trench 12.

After the photoresist 25 is removed, as shown in FIG. 9(c), the interlayer insulating film 13 is formed to cover the gate electrode 8, and the side surfaces (i.e., the side surfaces formed by the patterning) of the p-type impurity region 50 and the n-type impurity region 51. Then, an opening is formed in the interlayer insulating film 13, for example, by RIE using a resist mask (not shown) exposing part of the source region 4 and the body region 3. For example, CF gas may be used for etching the interlayer insulating film 13. At this time, in order to reliably electrically insulate the p-type impurity region 50 and the n-type impurity region 51 from the source electrode 10 (see FIG. 9(d)), which will be described later, the opening of the interlayer insulating film 13 is formed outside the p-type impurity region 50 and the n-type impurity region 51.

Next, similar to the step shown in FIG. 4(d) of the first embodiment, as shown in FIG. 9(d), the source electrode 10, the drain electrode 9, the gate interconnect, the source interconnect, etc., are formed.

In the method of the above-described second embodiment, the step of forming a mask for forming the p-type impurity region 50 and the n-type impurity region 51 by ion implantation can be omitted, as compared to the manufacturing method of the first embodiment. In particular, where SiC is used as a material of the substrate 1, the ion implantation needs to be performed at a high temperature of 500° C., which requires the plurality of steps such as deposition of an oxide film, etc., which serves as a hard mask, pattern formation with photoresist, pattern transfer by etching the oxide film, etc., and removal of the photoresist to from an ion implantation mask. As a result, in the second embodiment, in which the p-type impurity region 50 and the n-type impurity region 51 are formed by epitaxial growth without using ion implantation, the number of the steps largely decreases and the mass productivity significantly improves.

Similar to the first embodiment, the second embodiment mitigates an increase in the gate-source capacitance, increases the breakdown voltage of the gate insulating film 11, and increases the cross-sectional area of the gate electrode 8, thereby easily mitigating an increase in the gate resistance.

Third Embodiment

An example semiconductor device and a method of manufacturing the device according to a third embodiment will be described hereinafter with reference to the drawings.

Figure 10:
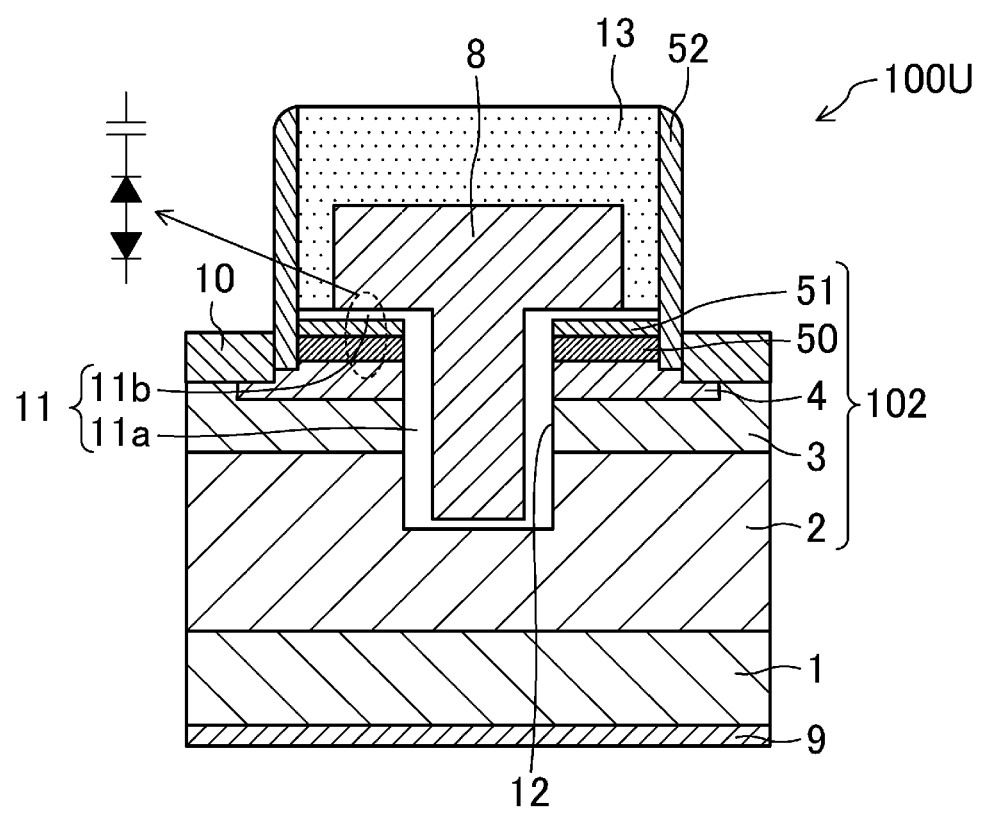
[FIG. 10]

FIG. 10 illustrates the cross-sectional structure of the semiconductor device according to the third embodiment.

The semiconductor device of this embodiment is a SiC-metal insulator semiconductor field effect transistor (MISFET) having a trench gate structure, and includes a plurality of unit cells 100U, similar to the structure of the semiconductor device according to the first embodiment shown in FIG. 1 as viewed from above. As shown in FIG. 10, each of the unit cells 100U includes a semiconductor layer 102 provided on a front surface (i.e., a principal surface) of a substrate 1 containing SiC. The semiconductor layer 102 includes an n-type drift region 2, a p-type body region 3 provided on the drift region 2, and an n-type source region 4 provided in the upper portion of the body region 3. The source region 4 is surrounded by the body region 3.

In this embodiment, a p-type impurity region 50 is formed on the source region 4, and an n-type impurity region 51 is formed on the p-type impurity region 50. The surfaces of the p-type impurity region 50 and the n-type impurity region 51 (i.e., the surfaces opposite to a trench 12, which will be described layer) are substantially flush (i.e., form a continuous plane), and the side surfaces are exposed from the source region 4.

In this embodiment, as shown in FIG. 10, the side surfaces of the p-type impurity region 50 and the n-type impurity region 51 are substantially perpendicular to the principal surface of the substrate 1. However, the surfaces of the p-type impurity region 50 and the n-type impurity region 51 may be inclined from the principal surface of the substrate 1 at an angle other than 90°, and the surfaces may have curvature.

The impurity concentration and the depth of the p-type impurity region 50 and the n-type impurity region 51 may be determined, for example, similarly to the first embodiment.

The trench 12, the gate insulating film 11, and the gate electrode 8 may have structures similar to those in, for example, the first embodiment.

Where the portion of the gate electrode 8 expanding around the trench 12 overlaps the n-type impurity region 51 even a little, a depletion layer can be formed below the overlapping region, thereby obtaining advantages. However, the entire portion of the gate electrode 8 expanding around the trench 12 preferably overlaps the n-type impurity region 51, in other words, the width of the gate electrode 8 at the portion expanding around the trench 12 is preferably smaller than the width of the n-type impurity region 51 in the direction along the principal surface of the semiconductor layer 102. As a result, the depletion layer is formed across the entire region below the portion of the gate electrode 8 expanding around the trench 12, thereby exhibiting the above-described advantages more significantly.

As shown in FIG. 10, a source electrode (i.e., a source-body electrode) 10, which is electrically coupled to the source region 4 and the body region 3, is provided on the semiconductor layer 102. In this embodiment, the source electrode 10 surrounds the trench 12. The source electrode 10 is provided outside the p-type impurity region 50 as viewed from the trench 12, and is electrically insulated from the p-type impurity region 50 and the n-type impurity region 51 by an insulating sidewall spacer 52. In addition, an interlayer insulating film 13 covering the gate electrode 8 is provided on the semiconductor layer 102. An opening exposing the source electrode 10 is provided in the interlayer insulating film 13, and the sidewall surface of the opening close to the gate electrode 8 is covered by the insulating sidewall spacer 52 as well as the side surfaces of the p-type impurity region 50 and the n-type impurity region 51 opposite to the trench 12.

The drain electrode 9, a gate interconnect, a source interconnect, etc., may have structures similar to those in, for example, the first embodiment.

FIG. 10 also illustrates an equivalent circuit having the multilayer of the source region 4, the p-type impurity region 50, the n-type impurity region 51, the gate insulating film 11, and the gate electrode 8.

In the above-described second embodiment, the spaces are provided between the p-type impurity region 50 and the source electrode 10, and between the n-type impurity region 51 and the source electrode 10 to electrically insulate the p-type impurity region 50 and the n-type impurity region 51 from the source electrode 10 (see FIG. 7). Specifically, spaces of about hundreds of nm are preferably provided as the spaces in view of variation in sizes, misalignment, etc., in conventional photolithography.

On the other hand, in the third embodiment, the sidewall surface of the opening in the interlayer insulating film 13 is substantially in the same position as the surfaces of the p-type impurity region 50 and the n-type impurity region 51 to form the source electrode 10, and the insulating sidewall spacer 52 is used for electrical isolation of the p-type impurity region 50 and the n-type impurity region 51 from the source electrode 10. Thus, the p-type impurity region 50 and the n-type impurity region 51 can be electrically isolated from the source electrode 10 by a distance of, for example, about 100 nm or less, thereby further reducing the chip area. This improves the mass productivity, and increases the filling rate of the unit cells 100U as compared in the same chip area so that a large current flows.

Figure 11:
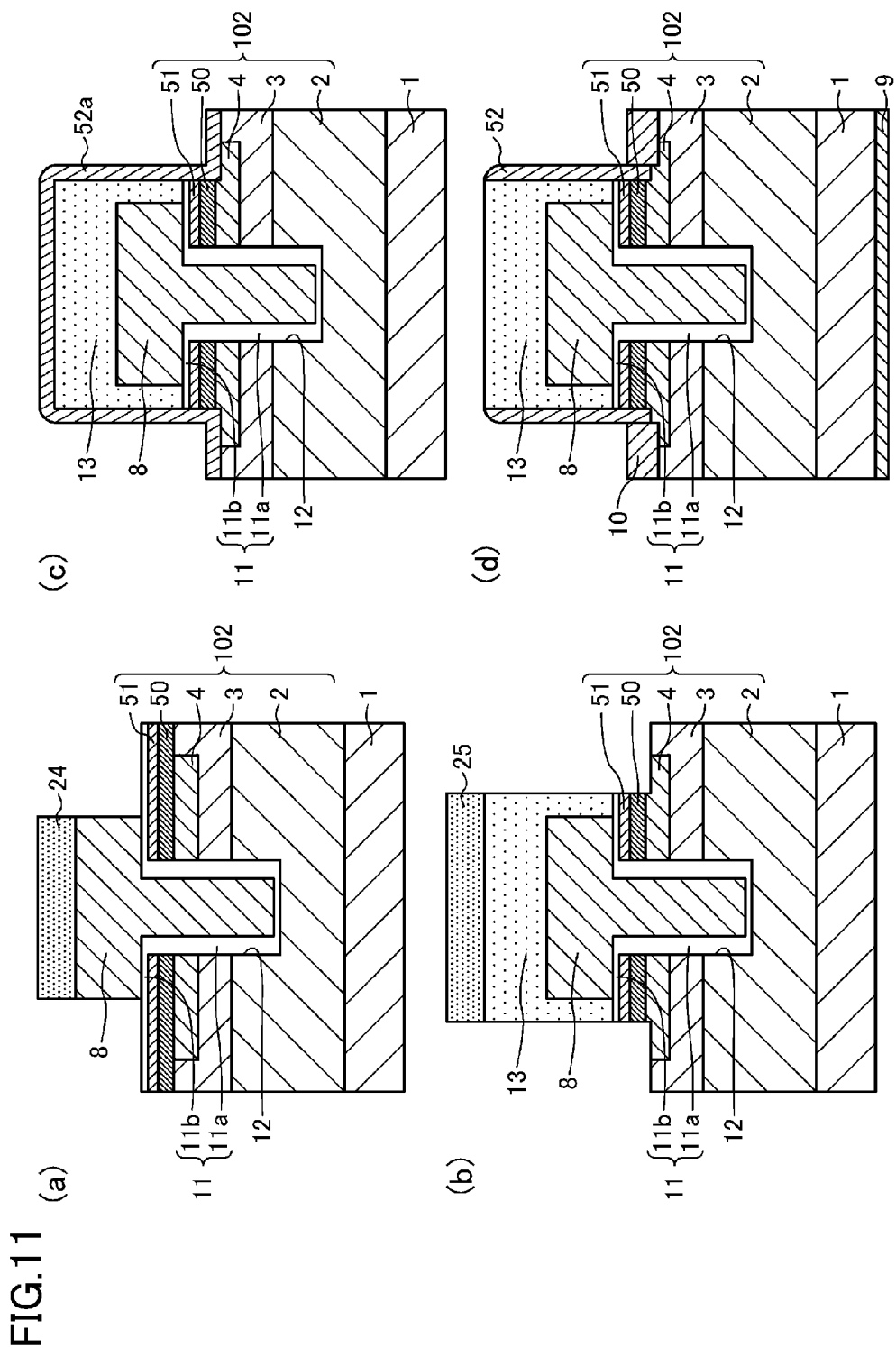
[FIG. 11]

FIGS. 11(*a*)-11(*d*) are cross-sectional views illustrating steps of a method of manufacturing the example semiconductor device according to the third embodiment.

Figure 8:
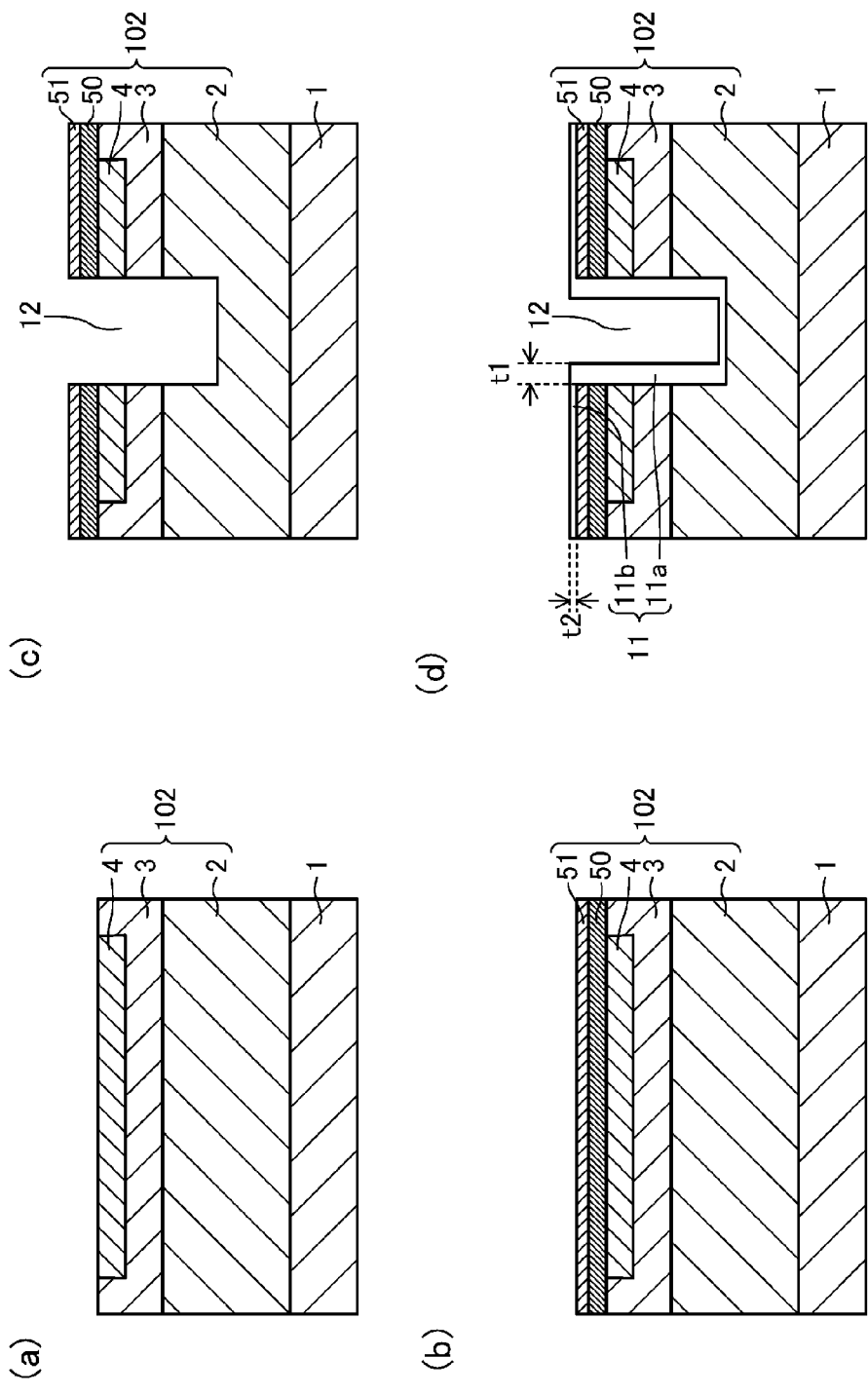
[FIG. 8]
Figure 9:
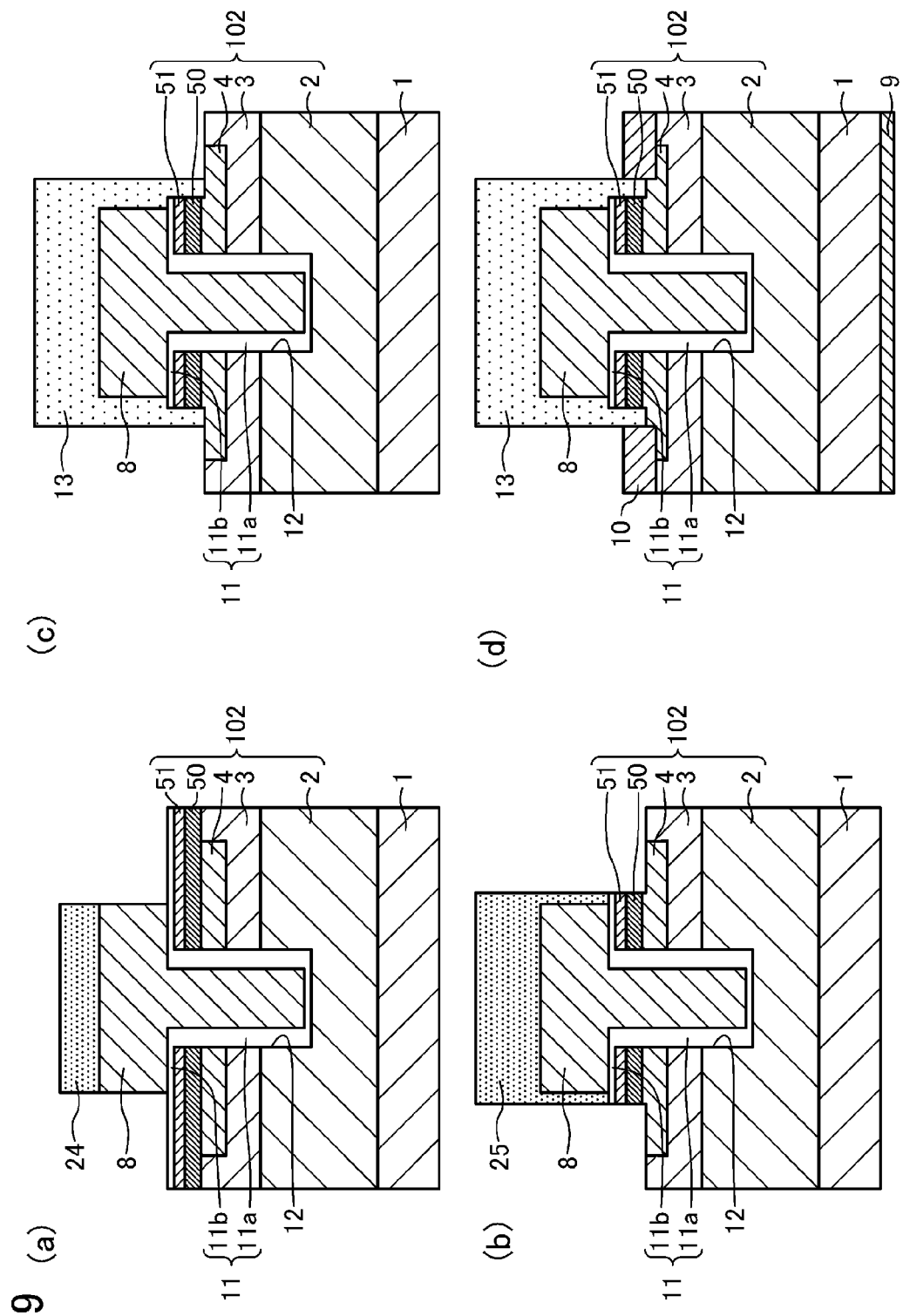
[FIG. 9]

First, for example, the steps in the method of manufacturing the semiconductor device according to the second embodiment shown in FIGS. 8(*a*)-8(*d*), and 9(*a*) are performed to obtain the structure shown FIG. 11(*a*) (i.e., the same structure as shown in FIG. 9(*a*)).

After the photoresist 24 is removed, as shown in FIG. 11(*b*), the interlayer insulating film 13 is deposited on the entire surface of the semiconductor layer 102 including the top of the gate electrode 8. Then, the interlayer insulating film 13 is open, and the gate insulating film 11, the n-type impurity region 51, the p-type impurity region 50, the source region 4 (the surface portion) and the body region 3 (the surface portion) are removed, for example, by RIE using a photoresist 25 covering the gate electrode 8 and the semiconductor layer 102 around the gate electrode 8 (i.e., the photoresist 25 which is open above part of the source region 4 and the body region 3). Mixed gas containing a compound of fluorine (F) and carbon (C), and oxygen (O) is used in etching the interlayer insulating film 13 and the gate insulating film 11. After that, the mixed gas is changed to, for example, chlorine (Cl) gas, thereby etching the n-type impurity region 51, the p-type impurity region 50, the source region 4 (the surface portion), and the body region 3 (the surface portion).

In this embodiment as well, similar to the second embodiment, the surface portion of the source region 4 is also removed partially by etching. In the second embodiment, since the distance between the source electrode 10 and the p-type impurity region 50 is sufficiently long, it is less problematic even if the etching stops in the middle of the p-type impurity region 50. However, in the third embodiment, since the p-type impurity region 50 is electrically isolated from the source electrode 10 by the insulating sidewall spacer 52 with a small width (see FIG. 11(*d*)), the portion of the p-type impurity region 50 in the opening of the interlayer insulating film 13 needs to be completely removed. Therefore, in view of variations in the step of etching, the etching preferably reaches the surface portion of the source region 4.

In this embodiment, the n-type impurity region 51 is patterned so that the entire portion of the gate electrode 8 expanding around the trench 12 overlaps the n-type impurity region 51. As a result, the multilayer of the source region 4, the p-type impurity region 50, and the n-type impurity region 51 can be provided across the entire region below the gate electrode 8 around the trench 12.

Next, after the photoresist 25 is removed, as shown in FIG. 11(*c*), for example, an oxide film is deposited as an insulating film 52*a*, which will be the insulating sidewall spacer 52 (see FIG. 11(*d*)), on the entire surface of the semiconductor layer 102 including the top of the interlayer insulating film 13. The insulating film 52*a* can be easily deposited, for example, by CVD.

Then, as shown in FIG. 11(d), the insulating film 52a is etched, for example, by RIE, thereby forming the insulating sidewall spacer 52 to cover the side surfaces (i.e., the side surfaces formed by patterning) of the interlayer insulating film 13, the n-type impurity region 51, and the p-type impurity region 50. The RIE is easily performed using, for example, mixed gas containing a compound of fluorine (F) and carbon (C), and oxygen (O). After that, similar to the step shown in FIG. 4(d) of the first embodiment, the source electrode 10, the drain electrode 9, the gate interconnect, the source interconnect, etc., are formed.

In the method of the above-described third embodiment, since the step of partially removing the p-type impurity region 50 and the n-type impurity region 51 is performed at the same time as the step of forming the opening in the interlayer insulating film 13, the step of forming a mask for partially removing the p-type impurity region 50 and the n-type impurity region 51 can be omitted, as compared to the manufacturing method of the second embodiment. Therefore, the number of the steps decreases, and the mass productivity significantly improves in the third embodiment.

Similar to the first embodiment, the third embodiment mitigates an increase in the gate-source capacitance, increases the breakdown voltage of the gate insulating film 11, and increases the cross-sectional area of the gate electrode 8, thereby easily mitigating an increase in the gate resistance.

Fourth Embodiment

An example semiconductor device and a method of manufacturing the device according to a fourth embodiment will be described hereinafter with reference to the drawings.

Figure 12:
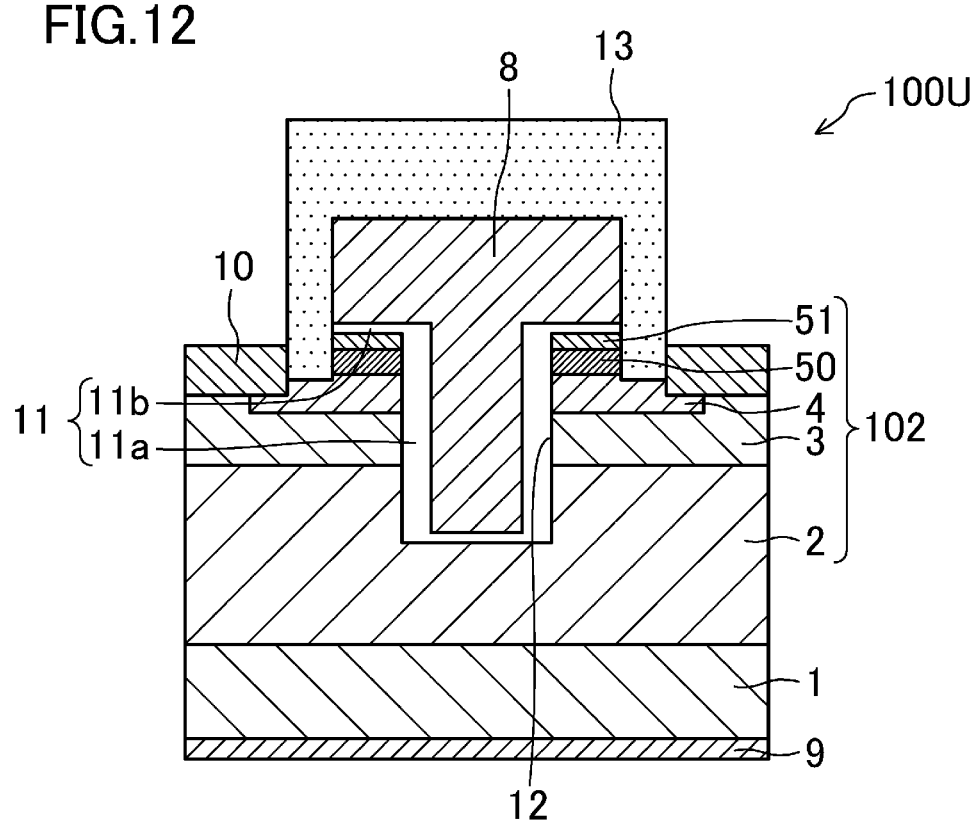
[FIG. 12]

FIG. 12 illustrates the cross-sectional structure of the semiconductor device according to the fourth embodiment.

The semiconductor device of this embodiment is a SiC-metal insulator semiconductor field effect transistor (MISFET) having a trench gate structure, and includes a plurality of unit cells 100U, similar to the structure of the semiconductor device according to the first embodiment shown in FIG. 1 as viewed from above. As shown in FIG. 12, each of the unit cells 100U includes a semiconductor layer 102 provided on a front surface (i.e., a principal surface) of a substrate 1 containing SiC. The semiconductor layer 102 includes an n-type drift region 2, a p-type body region 3 provided on the drift region 2, and an n-type source region 4 provided in the upper portion of the body region 3. The source region 4 is surrounded by the body region 3.

In this embodiment, a p-type impurity region 50 is formed on the source region 4, and an n-type impurity region 51 is formed on the p-type impurity region 50. The surfaces of the p-type impurity region 50 and the n-type impurity region 51 (i.e., the surfaces opposite to a trench 12, which will be described layer) are substantially flush (i.e., form a continuous plane), and the side surfaces are exposed from the source region 4.

In this embodiment, as shown in FIG. 12, the side surfaces of the p-type impurity region 50 and the n-type impurity region 51 are substantially perpendicular to the principal surface of the substrate 1. However, the surfaces of the p-type impurity region 50 and the n-type impurity region 51 may be inclined from the principal surface of the substrate 1 at an angle other than 90°, and the surfaces may have curvature.

The impurity concentration and the depth of the p-type impurity region 50 and the n-type impurity region 51 may be determined, for example, similarly to the first embodiment.

The trench 12, the gate insulating film 11, and the gate electrode 8 may have structures similar to those in, for example, the first embodiment.

Where the portion of the gate electrode 8 expanding around the trench 12 overlaps the n-type impurity region 51 even a little, a depletion layer can be formed below the overlapping region, thereby obtaining advantages. However, the entire portion of the gate electrode 8 expanding around the trench 12 preferably overlaps the n-type impurity region 51, in other words, the width of the gate electrode 8 at the portion expanding around the trench 12 is preferably smaller than or equal to the width of the n-type impurity region 51 in the direction along the upper surface of the semiconductor layer 102. For example, in this embodiment, the side surfaces of the p-type impurity region 50 and the n-type impurity region 51 opposite to the trench 12 are substantially flush with (i.e., form a continuous plane with) the side surface of the gate electrode 8 around the trench 12. Thus, the width of the gate electrode 8 at the portion expanding around the trench 12 is nearly equal to the width of the n-type impurity region 51. As a result, the depletion layer is formed across the entire region below the portion of the gate electrode 8 expanding around the trench 12, thereby exhibiting the above-described advantages more significantly.

As shown in FIG. 12, a source electrode (i.e., a source-body electrode) 10, which is electrically coupled to the source region 4 and the body region 3, is provided on the semiconductor layer 102. In this embodiment, the source electrode 10 surrounds the trench 12. The source electrode 10 is provided outside the p-type impurity region 50 as viewed from the trench 12. In addition, an interlayer insulating film 13 covering the gate electrode 8 is provided on the semiconductor layer 102. The interlayer insulating film 13 also covers the side surfaces of the p-type impurity region 50 and the n-type impurity region 51 opposite to the trench 12. An opening exposing the source electrode 10 is provided in the interlayer insulating film 13. The p-type impurity region 50 and the n-type impurity region 51 are electrically insulated from the source electrode 10 by the interlayer insulating film 13.

The drain electrode 9, a gate interconnect, a source interconnect, etc., may have structures similar to those in, for example, the first embodiment.

In the above-described third embodiment, the insulating sidewall spacer 52 is used for electrical isolation of the p-type impurity region 50 and the n-type impurity region 51 from the source electrode 10. This increases the chip area by the width of the insulating sidewall spacer 52. In general, where an insulating sidewall spacer is used, electrical isolation, for example, by about 100 nm or less is possible.

On the other hand, in the fourth embodiment, the side surface of the gate electrode 8 around the trench 12 is substantially flush with (i.e., forms a continuous plane with) the side surfaces of the p-type impurity region 50 and the n-type impurity region 51 opposite to the trench 12, thereby reducing the chip area by the width of the insulating sidewall spacer 52, as compared to the third embodiment. This improves the mass productivity, and increases the filling rate of the unit cells 100U as compared in the same chip area so that a large current flows.

FIG. 12 illustrates that the side surface of the gate electrode 8 around the trench 12 is substantially flush with (i.e., forms a continuous plane with) the side surfaces of the p-type impurity region 50 and the n-type impurity region 51 opposite to the trench 12.

Figure 13:
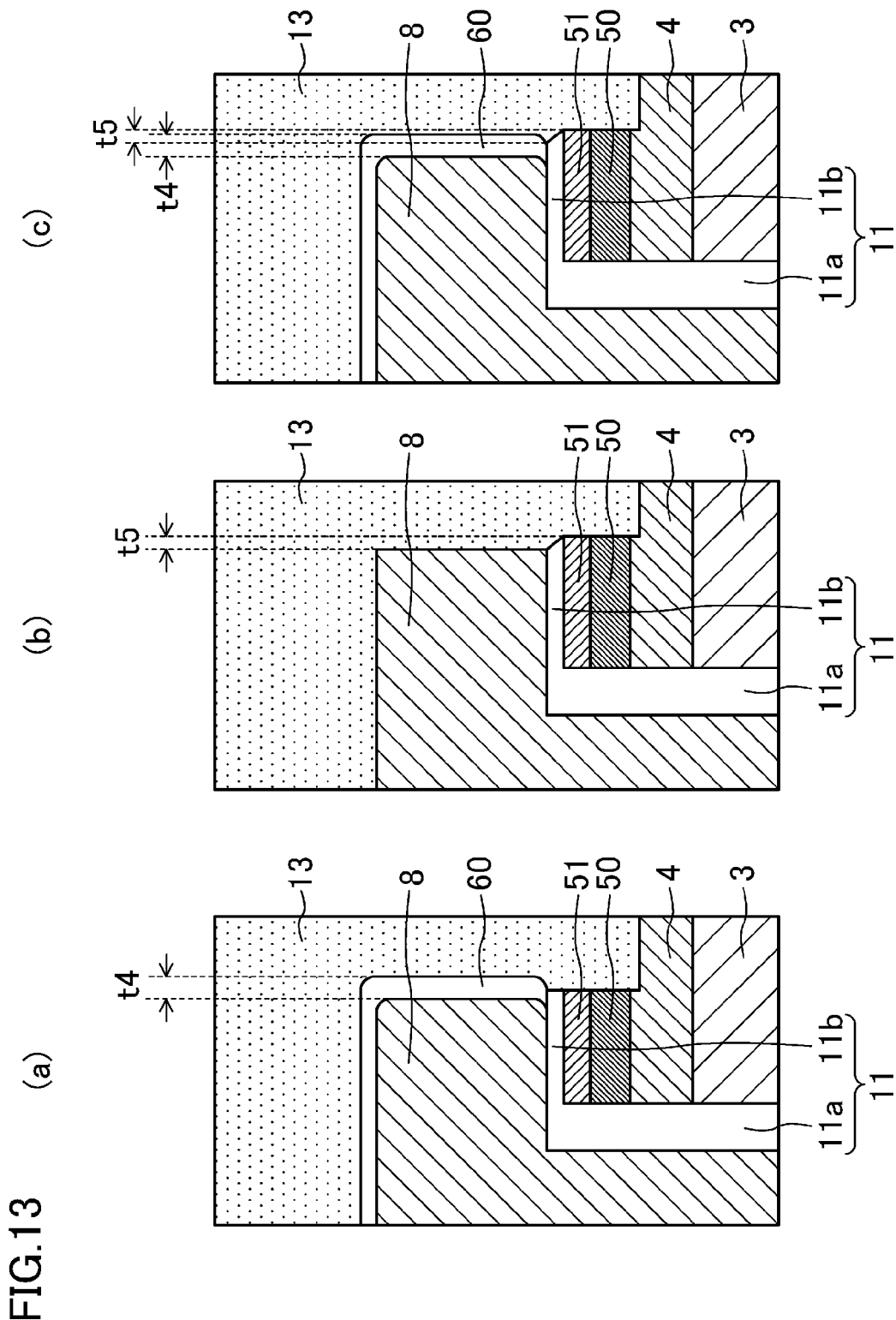
[FIG. 13]

On the other hand, as shown in FIG. 13(a), the gate electrode oxide film 60 (e.g., with a thickness t4) may be formed around the gate electrode 8 by thermal oxidation so that the gate electrode 8 recovers from a damage caused by the etching in forming the gate electrode 8. In this case, since the size of the gate electrode 8 is reduced by about half the thickness t4, the side surfaces of the p-type impurity region 50 and the n-type impurity region 51 opposite to the trench 12 are spaced apart from the side surface of the gate electrode 8 around the trench 12 by about ½×t4. Where the gate electrode oxide film 60 has a thickness of, for example, about 50 nm or less, the distance between the surface of the gate electrode 8 around the trench 12 and the side surfaces of the p-type impurity region 50 and the n-type impurity region 51 opposite to the trench 12 is about 25 nm or less.

In this embodiment, etching of the gate insulating film 11 is required between the etching for forming the gate electrode 8, and the etching for removing the n-type impurity region 51 and the p-type impurity region 50. As shown in FIG. 13(b), the gate insulating film 11 may be etched to have a taper or a step with a width t5. In this case, the side surfaces of the p-type impurity region 50 and the n-type impurity region 51 opposite to the trench 12 are spaced apart from the side surface of the gate electrode 8 around the trench 12 by about t5. Since the width t5 of the taper or the step of the gate insulating film 11 is generally about twice or less the thickness of the gate insulating film 11 which is the material to be etched (specifically, the thickness of about 30 nm of the second insulating film 11b (see the first embodiment)), t5 is, for example, about 60 nm or less.

Clearly, as shown in FIG. 13(c), where the gate insulating film 11 has the taper or the step of the width t5, the gate electrode oxide film 60 may be formed. In this case, the side surfaces of the p-type impurity region 50 and the n-type impurity region 51 opposite to the trench 12 are spaced apart from the side surface of the gate electrode 8 around the trench 12 by about (½×t4)+t5. In view of the above-described values, the distance is about 85 nm or less.

In the first to third embodiments, a gate electrode oxide film 60 may be formed, or the gate insulating film 11 may have a taper or a step.

Figure 14:
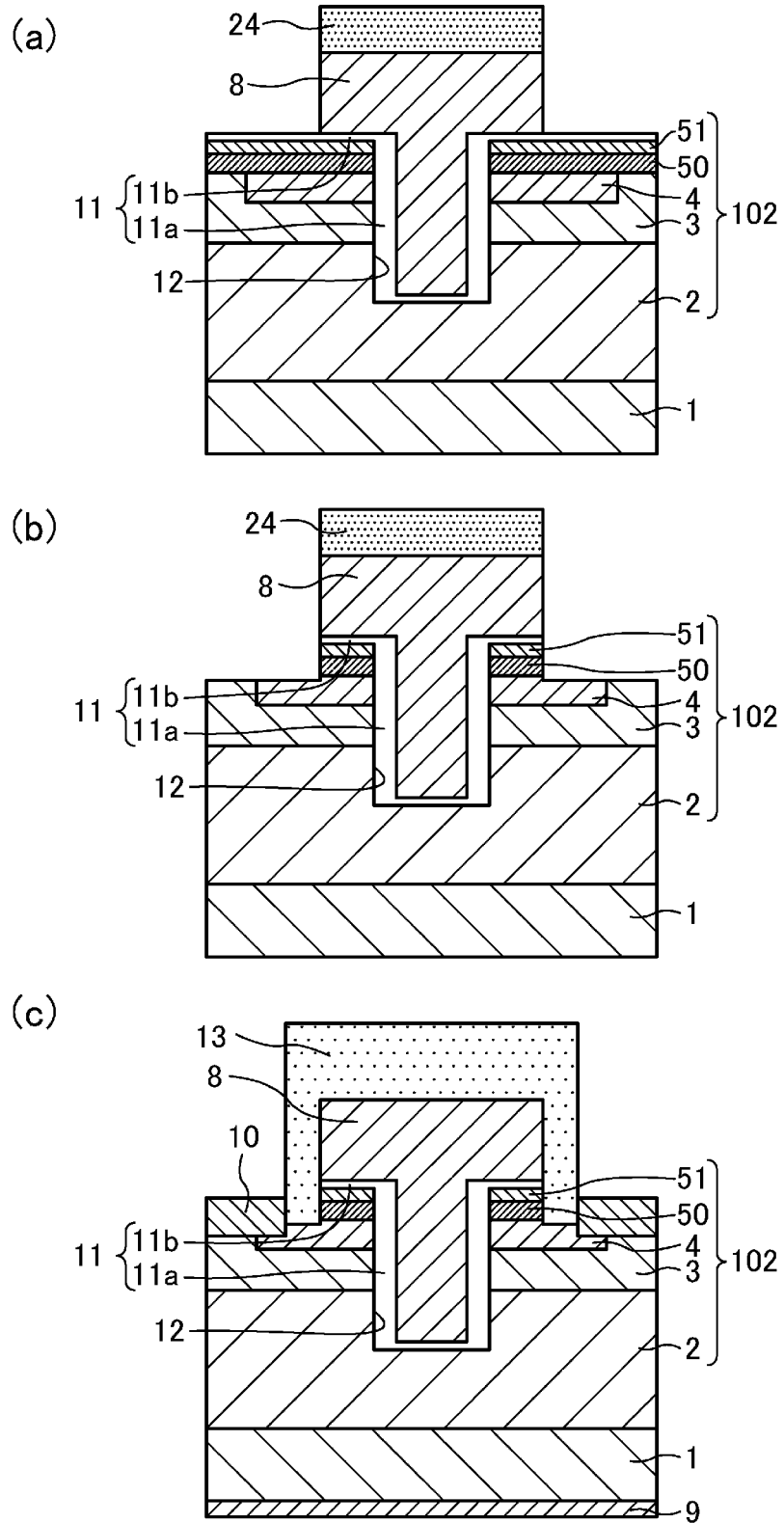
[FIG. 14]

FIGS. 14(a)-14(c) are cross-sectional views illustrating steps of a method of manufacturing the semiconductor device according to the fourth embodiment.

First, for example, the steps in the method of manufacturing the semiconductor device according to the second embodiment shown in FIGS. 8(a)-8(d), and 9(a) are performed to obtain the structure shown FIG. 14(a) (i.e., the same structure as shown in FIG. 9(a)).

Then, as shown in FIG. 14(b), after the gate insulating film 11 is open using a photoresist 24, which is an etching mask for forming the gate electrode 8, the n-type impurity region 51, the p-type impurity region 50, the source region 4 (the surface portion), and the body region 3 (the surface portion) are sequentially removed. Mixed gas containing a compound of fluorine (F) and carbon (C), and oxygen (O) is used in etching the gate insulating film 11. After that, the mixed gas is changed to, for example, chlorine (Cl) gas, thereby etching the n-type impurity region 51, the p-type impurity region 50, the source region 4 (the surface portion), and the body region 3 (the surface portion).

In this embodiment as well, similar to the second embodiment, the surface portion of the source region 4 is also removed partially by etching. In the second embodiment, since the distance between the source electrode 10 and the p-type impurity region 50 is sufficiently long, it is less problematic even if the etching stops in the middle of the p-type impurity region 50. However, in the fourth embodiment, the p-type impurity region 50 needs to be completely removed in a region outside the gate electrode 8 including the opening of the interlayer insulating film 13 (see FIG. 14(C)), which will be described layer, to electrically isolate the p-type impurity region 50 from the source electrode 10. Therefore, in view of variations in the step of etching, the etching preferably reaches the surface portion of the source region 4.

In this embodiment, the n-type impurity region 51 and the p-type impurity region 50 are patterned so that the entire portion of the gate electrode 8 expanding around the trench 12 overlaps the n-type impurity region 51. As a result, the multilayer of the source region 4, the p-type impurity region 50, and the n-type impurity region 51 can be provided across the entire region below the gate electrode 8 around the trench 12.

After the photoresist 24 is removed, similar to the step shown in FIG. 9(c) of the second embodiment, as shown in FIG. 14(c), the interlayer insulating film 13 is formed, and then, similar to the step shown in FIG. 4(d) of the first embodiment, the source electrode 10, the drain electrode 9, the gate interconnect, the source interconnect, etc. are formed.

In the method of the above-described fourth embodiment, the step of forming the insulating sidewall spacer 52 can be omitted, as compared to the manufacturing method of the third embodiment. Therefore, the number of the steps decreases, and the mass productivity significantly improves in the fourth embodiment.

Similar to the first embodiment, the fourth embodiment mitigates an increase in the gate-source capacitance, increases the breakdown voltage of the gate insulating film 11, and increases the cross-sectional area of the gate electrode 8, thereby easily mitigating an increase in the gate resistance.

In the second to fourth embodiments, an example has been described where the upper corner of the trench 12 has almost a right angle. However, similar to the first variation of the first embodiment shown in FIG. 5, the upper corner of the trench 12 may be rounded to be a curbed corner in the second to fourth embodiments. The method of rounding the upper corner of the trench 12 is similar to that in the first variation of the first embodiment.

In each of the second to fourth embodiments, the MISFET having the inversion channel structure has been described. However, similar to the second variation of the first embodiment shown in FIG. 6, a MISFET having an accumulation channel structure may have a structure similar to those in the second to fourth embodiments. The structure and the manufacturing method of the MISFET having the accumulation channel structure are similar to those in the second variation of the first embodiment.

Fifth Embodiment

An example semiconductor device and a method of manufacturing the device according to a fifth embodiment will be described hereinafter with reference to the drawings.

Figure 15:
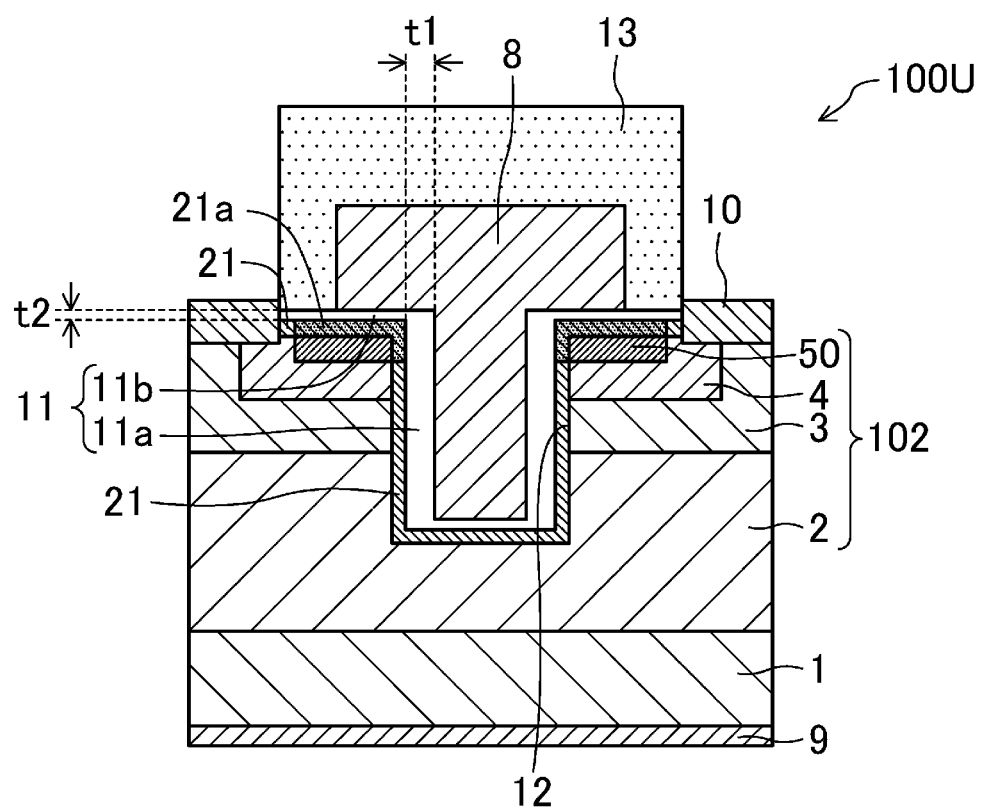
[FIG. 15]

FIG. 15 illustrates the cross-sectional structure of the semiconductor device according to the fifth embodiment.

The semiconductor device of this embodiment is a SiC-metal insulator semiconductor field effect transistor (MISFET) having a trench gate structure, and includes a plurality of unit cells 100U, similar to the structure of the semiconductor device according to the first embodiment shown in FIG. 1 as viewed from above. As shown in FIG. 15, each of the unit cells 100U includes a semiconductor layer 102 provided on a front surface (i.e., a principal surface) of a substrate 1 containing SiC. The semiconductor layer 102 includes an n-type drift region 2, a p-type body region 3 provided on the drift region 2, and an n-type source region 4 provided in the upper portion of the body region 3. The source region 4 is surrounded by the body region 3.

In this embodiment, the p-type impurity region 50 is formed in the upper portion of the source region 4 to be surrounded by the source region 4.

As shown in FIG. 15, the semiconductor layer 102 includes a trench (i.e., a recess) 12, which penetrates the p-type impurity region 50, the source region 4, and the body region 3, and reaches the drift region 2. An n-type channel layer 21 is formed on the sidewall surface and the bottom of the trench 12, and on the semiconductor layer 102 around the trench 12. A gate insulating film 11 is formed on the n-type channel layer 21 inside and around the trench 12. The gate insulating film 11 includes a first insulating film 11a provided on the sidewall surface of the trench 12, and a second insulating film 11b provided around the trench 12. In this embodiment, a thickness t1 of the first insulating film 11a is greater than or equal to a thickness t2 of the second insulating film 11b.

The n-type channel layer 21 is formed, for example, by epitaxial growth, and the impurity concentration and the thickness of the n-type channel layer 21 are set to about $1 \times 10^{17}$ cm$^{-3}$ and about 70 nm as an example to control the threshold voltage of the transistor. The impurity concentration and the thickness of the n-type channel layer 21 may be set to about $1 \times 10^{18}$ cm$^{-3}$ and about 25 nm as another example.

The impurity concentration and the depth (i.e., the depth from the upper surface of the semiconductor layer 102) of the p-type impurity region 50 are preferably determined depending on the impurity concentration and the thickness of the n-type channel layer 21. In this embodiment, the impurity concentration of the p-type impurity region 50 is increased, thereby completely depleting the portion of the n-type channel layer 21, which is in contact with the p-type impurity region 50, to form a depletion layer 21a.

Specifically, where the impurity concentration and the thickness of the n-type channel layer 21 are set to about $1 \times 10^{17}$ cm$^{-3}$ and about 70 nm as in the example, the impurity concentration and the depth of the p-type impurity region 50 may be set to about $2 \times 10^{17}$ cm$^{-3}$ or more and about 70 nm or more. Where the impurity concentration and the thickness of the n-type channel layer 21 are set to $1 \times 10^{18}$ cm$^{-3}$ and about 25 nm as in the other example; the impurity concentration and the depth of the p-type impurity region 50 may be set to about $2 \times 10^{18}$ cm$^{-3}$ or more and about 25 nm or more. In the both cases, since the n-type channel layer 21 has a lower impurity concentration than the p-type impurity region 50, the depletion layer between the p-type impurity region 50 and the n-type channel layer 21 is mainly formed at the side of the n-type channel layer 21. In other words, the depletion layer formed in the p-type impurity region 50 has a smaller thickness than the n-type channel layer 21.

As described above, the impurity concentration of the p-type impurity region 50 is preferably determined so that the portion of the n-type channel layer 21, which is in contact with the p-type impurity region 50, is completely depleted to form the depletion layer 21a.

Where the impurity concentration of the n-type channel layer 21 is $N_D$, and the impurity concentration of the p-type impurity region 50 is $N_A$, the width D of the depletion layer 21a (hereinafter referred to as a depletion layer width) is calculated as follows.

$$D=\sqrt{(2 \cdot \in \cdot \in_0 \cdot (N_A-N_D)/(q \cdot N_A \cdot N_D \cdot (\phi_0-V)))}$$

Note that, $\in=10.03$, $\in_0=8.85 \times 10^{-12}$(F/cm), q=$1.6 \times 10^{-14}$(C), and $\phi_0=2.7$ (V). In the equation, $\in$ represents a dielectric constant, $\in_0$ represents a vacuum dielectric constant, q represents a charge, $\phi_0$ represents the height of a barrier between the p-type impurity region 50 and the n-type channel layer 21, and V represents a voltage between the p-type impurity region 50 and the n-type channel layer 21.

Since the impurity concentration and the thickness of the n-type channel layer 21 are determined based on the setting of the threshold voltage of the transistor, the impurity concentration $N_A$ of the p-type impurity region 50 can be determined using the above-described equation so that the depletion layer width D has a value nearly equal to the thickness of the n-type channel layer 21. The thickness of the p-type impurity region 50 is preferably set to be greater than or equal to the thickness of the n-type channel layer 21.

The gate electrode 8 made of a conductive film is formed on the gate insulating film 11 to fill the trench 12, and expand on the semiconductor layer 102 around the trench 12. Thus, the gate electrode 8 has a T-shaped cross-section. The side surface of the gate electrode 8 at the portion buried in the trench 12 is in contact with the first insulating film 11a, and the portion of the gate electrode 8 around the trench 12 is in contact with the second insulating film 11b. As such, the gate electrode 8 is electrically insulated from the semiconductor layer 102 by the gate insulating film 11.

Where the portion of the gate electrode 8 expanding around the trench 12 overlaps the p-type impurity region 50 even a little with the n-type channel layer 21 interposed therebetween, the depletion layer 21a can be formed in the overlapping region, thereby obtaining advantages. However, the entire portion of the gate electrode 8 expanding around the trench 12 preferably overlaps the p-type impurity region 50, in other words, the width of the gate electrode 8 at the portion expanding around the trench 12 is preferably smaller than the width of the p-type impurity region 50 in the direction along the upper surface of the semiconductor layer 102. As a result, the depletion layer 21a is formed across the entire region below the portion of the gate electrode 8 expanding around the trench 12, thereby exhibiting the above-described advantages more significantly.

As described above, in this embodiment, at least the depletion layer 21a, which the depleted portion of the n-type channel layer 21, is interposed between the source region 4 and the portion of the gate electrode 8 expanding on the upper surface of the semiconductor layer 102 around the trench 12, in addition to the gate insulating film 11. Thus, the capacitance generated between the gate electrode 8 and the source region 4 decreases, as compared to the case where only the gate insulating film 11 is interposed between the gate electrode 8 and the source region 4. This reduces the parasitic capacitance between the gate electrode 8 and the source region 4, and distributes the voltage applied to the gate insulating film 11 to the depletion layer 21a, thereby increasing the dielectric breakdown strength of the gate insulating film 11.

As shown in FIG. 15, a source electrode (i.e., a source-body electrode) 10, which is electrically coupled to the source region 4 and the body region 3, is provided on the semiconductor layer 102. In this embodiment, the source electrode 10 surrounds the trench 12. The source electrode 10 is provided outside the p-type impurity region 50 as viewed from the trench 12, and is electrically insulated from the p-type impurity region 50 with the source region 4 interposed therebetween. A drain electrode 9 is provided on the back surface (i.e., the surface opposite to the principal surface) of the substrate 1. In addition, an interlayer insulating film 13 covering the gate electrode 8 is provided on the semiconductor layer 102. Although not shown, the interlayer insulating film 13 includes a gate interconnect and a source interconnect, and the gate interconnect and the source interconnect are electrically coupled to the gate electrode 8 and the source electrode 10 via contact plugs.

Figure 16:
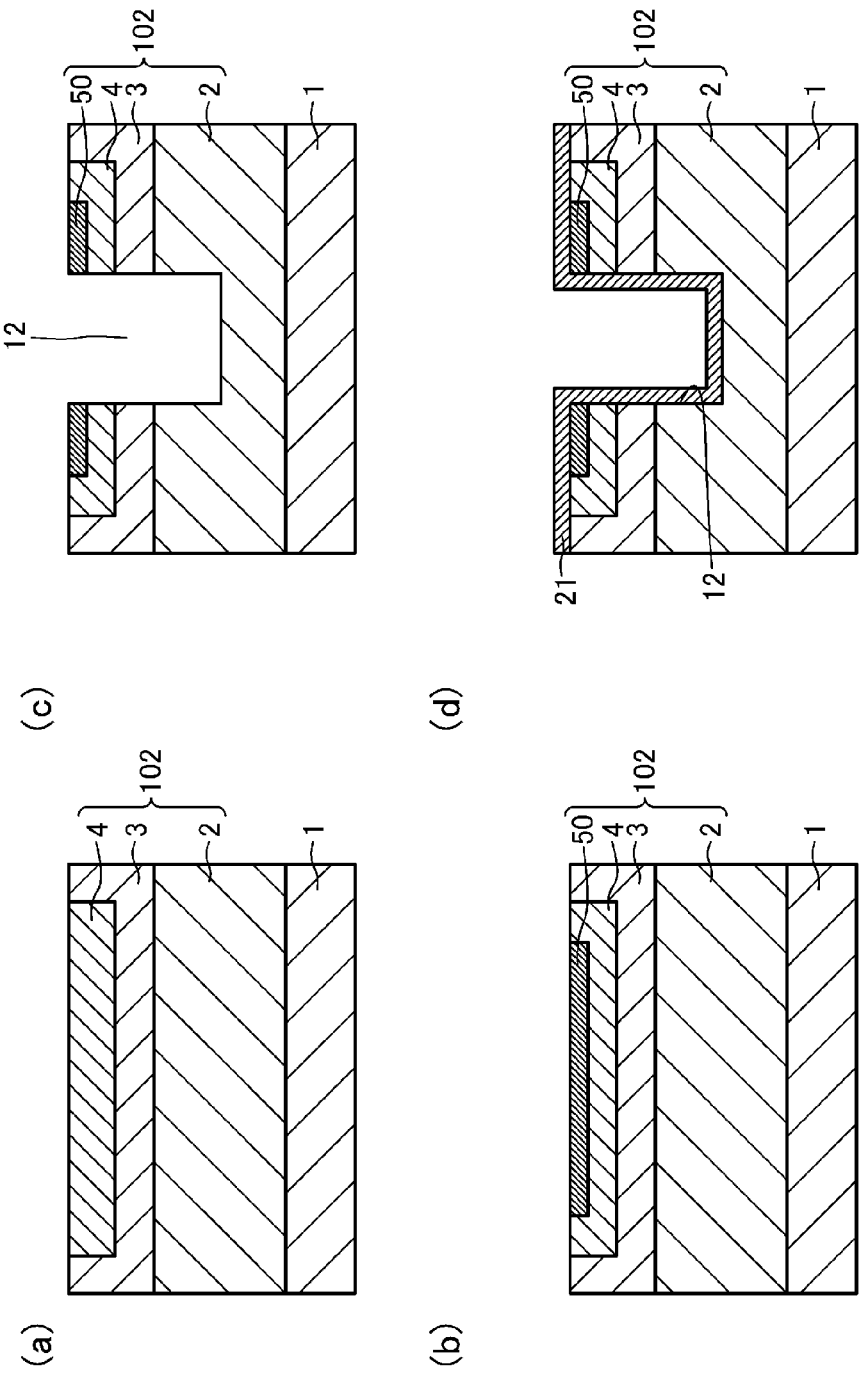
[FIG. 16]

FIGS. 16(a)-16(d) and 17(a)-17(d) are cross-sectional views illustrating steps of a method of manufacturing the semiconductor device according to the fifth embodiment First, as shown in FIG. 16(a), for example, a SiC layer is epitaxially grown on the principal surface of the substrate 1, thereby sequentially forming the n-type drift region 2 and the p-type body region 3. Then, the n-type source region 4 is formed in the upper portion of the body region 3, for example, by ion implantation. The details of the substrate 1, the drift region 2, the body region 3, and the source region 4 are similar to those in, for example, the first embodiment.

Then, as shown in FIG. 16(b), the p-type impurity region 50 is formed in the source region 4, for example, by ion implantation. The impurity concentration $N_A$ of the p-type impurity region 50 may be set, for example, so that the depletion layer width D (i.e., the width of the depletion layer 21a, which will be described layer) is nearly equal to the thickness of the n-type channel layer 21 remaining after the gate insulating film 11 (see FIG. 17(a)) is formed in a later step, in the following equation.

$$D=\sqrt{(2 \cdot \in \cdot \in_0 \cdot (N_A - N_D)/(q \cdot N_A N_D \cdot (\phi_0 - V)))}$$

Note that, $\in = 10.03$, $\in_0 = 8.85 \times 10^{-12}$ (F/cm), $q = 1.6 \times 10^{-14}$ (C), and $\phi_0 = 2.7$ (V). In the equation, $\in$ represents a dielectric constant, $\in_0$ represents a vacuum dielectric constant, q represents a charge, $\phi_0$ represents the height of a barrier between the p-type impurity region 50 and the n-type channel layer 21, and V represents a voltage between the p-type impurity region 50 and the n-type channel layer 21. $N_D$ represents the impurity concentration of the n-type channel layer 21.

The thickness of the p-type impurity region 50 may be set to greater than or equal to the thickness of the above-described n-type channel layer 21 remaining after the formation of the gate insulating film 11.

Specifically, where the impurity concentration and the thickness of the n-type channel layer 21 are set to, for example, about $1 \times 10^{17}$ cm$^{-3}$ and about 70 nm, the impurity concentration and the depth of the p-type impurity region 50 may be set to about $2 \times 10^{17}$ cm$^{-3}$ or more and about 70 nm or more. Where the impurity concentration and the thickness of the n-type channel layer 21 are set to for example, $1 \times 10^{18}$ cm$^{-3}$ and about 25 nm, the impurity concentration and the depth of the p-type impurity region 50 may be set to about $2 \times 10^{18}$ cm$^{-3}$ or more and about 25 nm or more.

A specific formation method of the p-type impurity region 50 may be similar to that in, for example, the first embodiment. After the formation of the p-type impurity region 50, annealing is performed, for example, under an inert gas atmosphere at a temperature of about 1700° C. for about 30 minutes. This activates impurity ions implanted into the source region 4, and the p-type impurity region 50.

After that, as shown in FIG. 16(c), the trench 12 is formed in the semiconductor layer 102. A specific formation method of the trench 12 may be, for example, similar to that in the first embodiment. The trench 12 is formed not to penetrate the drift region 2, and so that the bottom is lower than the interface between the drift region 2 and the body region 3. The trench 12 may have a depth of, for example, about 1.5 μm, and the trench may have a width of, for example, about 1 μm.

While in this embodiment, as shown in FIG. 16(c), an example has been described where the sidewall surface of the trench 12 is perpendicular to the principal surface of the substrate 1, the sidewall surface of the trench 12 may not be perpendicular to the principal surface of the substrate 1.

Then, as shown in FIG. 16(d), a SiC layer is deposited, as the n-type channel layer 21, for example, by epitaxial growth on the bottom and the sidewall surface of the trench 12, and on the semiconductor layer 102 around the trench 12. The impurity concentration and the thickness of the n-type channel layer 21 are about $1 \times 10^{17}$ cm$^{-3}$ and about 135 nm as an example, and about $1 \times 10^{18}$ cm$^{-3}$ and about 5 nm as another example. In forming the gate insulating film 11 (see FIG. 17(a)) in a later step, since the thickness of the n-type channel layer 21 decreases by about half the thickness of the gate insulating film 11, the thickness of the n-type channel layer 21 is determined in view of the decrease. The combination of the impurity concentration and the thickness of the n-type channel layer 21 are not limited to the above-described example values, and the combination is determined so that the threshold voltage of the transistor has a desired value, together with the impurity concentration of the body region 3 and the thickness of the gate insulating film 11, which will be formed in the later step.

Figure 17:
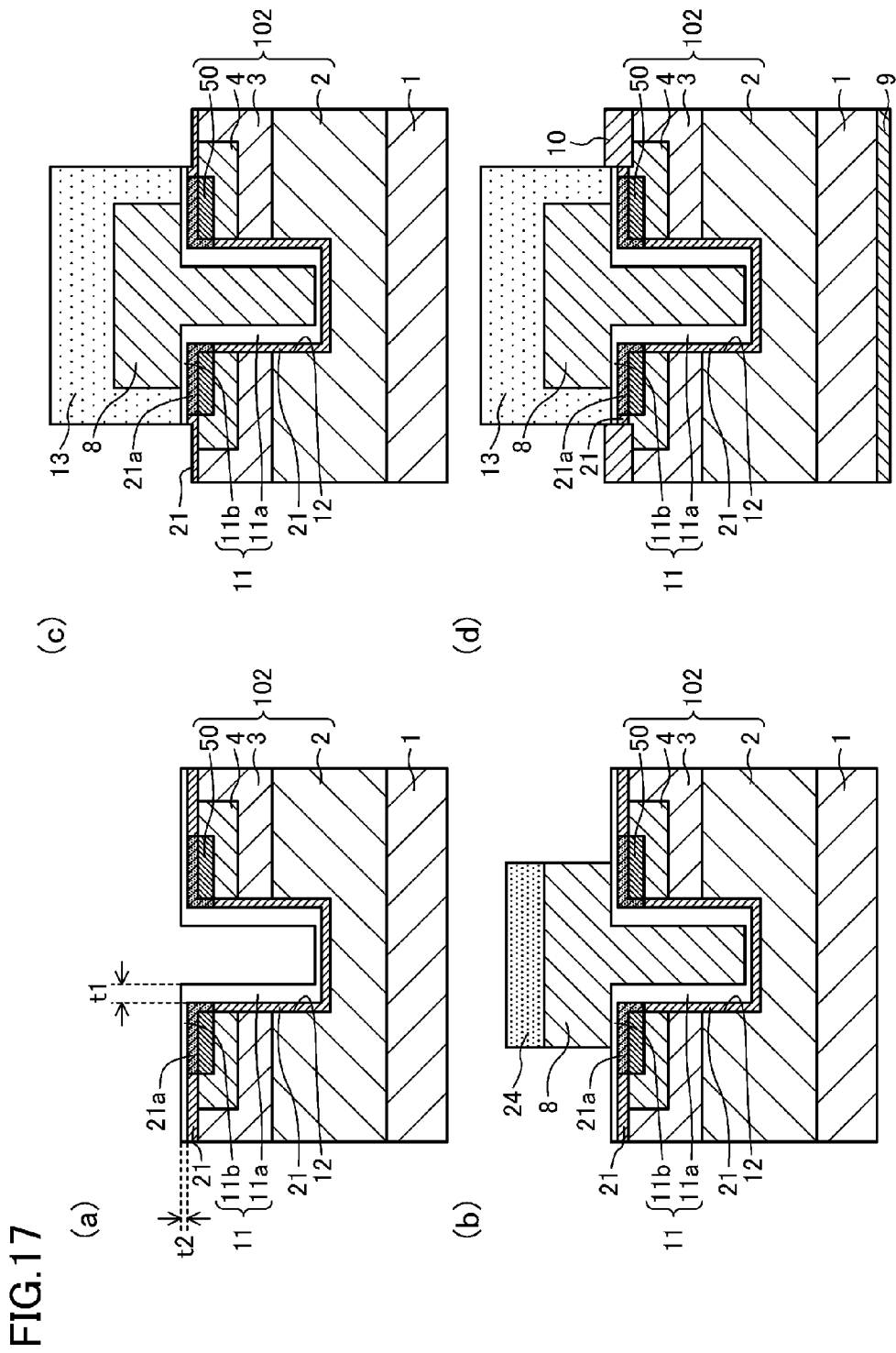
[FIG. 17]

Next, as shown in FIG. 17(a), an oxide film is formed as the gate insulating film 11, for example, by thermal oxidation on the n-type channel layer 21 inside and around the trench 12. Specifically, as the thermal oxidation, thermal treatment is performed, for example, under a dry oxidation atmosphere at a temperature of about 1200° C. for about one hour, thereby forming as part of the gate insulating film 11, the first insulating film 11a with the thickness t1 of, for example, about 70 nm on the (11-20) plane which is the sidewall surface of the trench 12. At this time, the second insulating film 11b with the thickness t2 of, for example, about 30 nm is formed on the (0001) Si plane which is the upper surface of the n-type channel layer 21 around the trench 12. The junction between the p-type impurity region 50 and the portion of the n-type channel layer 21 remaining after the formation of the gate insulating film 11, which is in contact with the p-type impurity region 50, is depleted, and as a result, almost the entire portion becomes the depletion layer 21a.

After that, as shown in FIG. 17(b), a conductive film is formed on the entire surface of the semiconductor layer 102 including the inside of the trench 12, and then, the conductive film is etched by RIE using the photoresist 24 as a mask. As a result, the T-shaped gate electrode 8 is formed on the gate insulating film 11 to fill the trench 12 and expand on the semiconductor layer 102 around the trench 12. The conductive film may be similar to the conductive film of the first embodiment.

In this embodiment, the gate electrode 8 is formed so that the entire portion of the gate electrode 8 expanding around the trench 12 overlaps the p-type impurity region 50 with the n-type channel layer 21 interposed therebetween. As a result, the multilayer of the gate insulating film 11 and the depletion layer 21a, which is the depleted portion of the n-type channel layer 21, can be provided across the entire region below the gate electrode 8 around the trench 12.

The gate electrode 8 preferably has a width of, for example, about 200 nm or more at the portion expanding around the trench 12 (i.e., the width in the direction along the upper surface of the semiconductor layer 102) in view of misalignment in lithography, etc. On the other hand, the width is preferably, for example, about 500 nm or less for higher integration of the elements.

After the photoresist 24 is removed, as shown in FIG. 17(c), the interlayer insulating film 13 is formed to cover the gate electrode 8, and then, an opening is formed in the interlayer insulating film 13, for example, by RIE using a resist mask (not shown) exposing part of the source region 4 and the body region 3. At this time, the portion of the gate insulating film 11 in the opening of the interlayer insulating film 13 is also removed. In order to reliably electrically insulate the p-type impurity region 50 from the source electrode 10 (see FIG. 17(d)), which will be described later, the opening of the interlayer insulating film 13 is formed outside the p-type impurity region 50.

Next, similar to the step shown in FIG. 4(d) of the first embodiment, as shown in FIG. 17(d), the source electrode 10, the drain electrode 9, the gate interconnect, the source interconnect, etc., are formed.

Assume that the substrate 1 is made of SiC, the principal surface of the substrate 1 is the (0001) Si plane, on which crystal growth is easily performed, and the thickness of the gate insulating film 11 on the sidewall surface of the trench 12 is set to, for example, about 70 nm. Then, since the (0001) Si plane is oxidized at extremely low speed, a SiO$_2$ film, which is formed on the upper surface of the semiconductor layer 102 by thermal oxidation, has a thickness of about 30 nm. Therefore, where the gate electrode 8 has a T-shaped cross-section, the gate electrode 8 is too close to the source region 4, thereby increasing the gate-source capacitance.

On the other hand, in this embodiment, the gate insulating film 11 is stacked on the depletion layer 21a, which is the portion of the n-type channel layer 21 in contact with the p-type impurity region 50, under the portion of the T-shaped gate electrode 8 on the upper surface of the semiconductor layer 102 around the trench 12. Since the depletion layer 21a is substantially an insulator, the depletion layer 21a provides the same advantage as increasing the thickness of the gate insulating film 11. This reduces the parasitic capacitance between the gate electrode 8 and the source region 4, as compared to the case where only the gate insulating film 11 is provided between the gate electrode 8 and the source region 4 (i.e., where the p-type impurity region 50 and the n-type impurity region 51 of this embodiment are not provided). Since a voltage between the gate electrode 8 and the source region 4 is separately applied to the gate insulating film 11 and the depletion layer 21a, the strength of the electric field applied to the gate insulating film 11 can be reduced, thereby increasing the breakdown field strength of the gate insulating film 11.

As above-described, this embodiment mitigates an increase in the gate-source capacitance, increases the breakdown voltage of the gate insulating film 11, and increases the cross-sectional area of the gate electrode 8, thereby easily mitigating an increase in the gate resistance.

Figure 18:
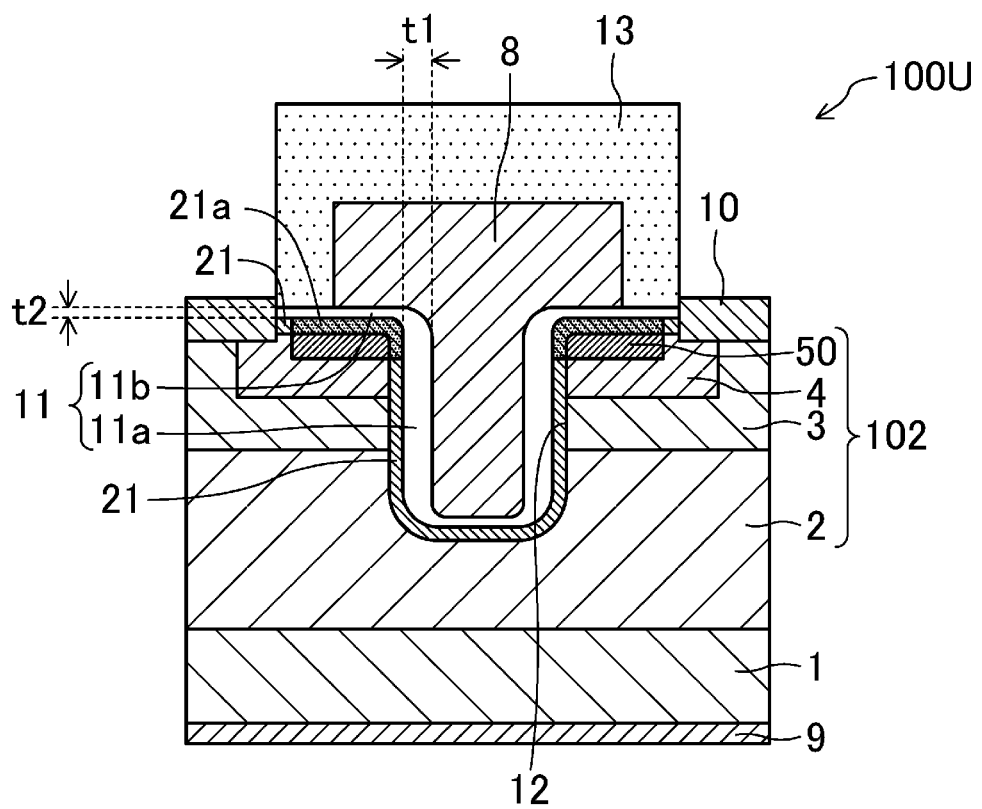
[FIG. 18]

FIG. 15 illustrates the example where the upper corner of the trench 12 has almost a right angle. However, as shown in FIG. 18, the upper corner of the trench 12 may be rounded to be a curbed corner. FIG. 18 is a cross-sectional view illustrating a semiconductor device according to a first variation of this embodiment. By rounding the upper corner of the trench 12, the electric field concentration at the upper corner of the trench 12 is reduced.

The semiconductor device according to the variation shown in FIG. 18 is obtained, for example, similarly to the semiconductor device according to the first variation of the first embodiment shown in FIG. 5. As shown in FIG. 18, not only the upper corner of the trench 12, but also the lower corner may be a curbed corner. This reduces the electric field concentration at the lower corner of the trench 12.

Sixth Embodiment

An example semiconductor device and a method of manufacturing the device according to a sixth embodiment will be described hereinafter with reference to the drawings.

Figure 19:
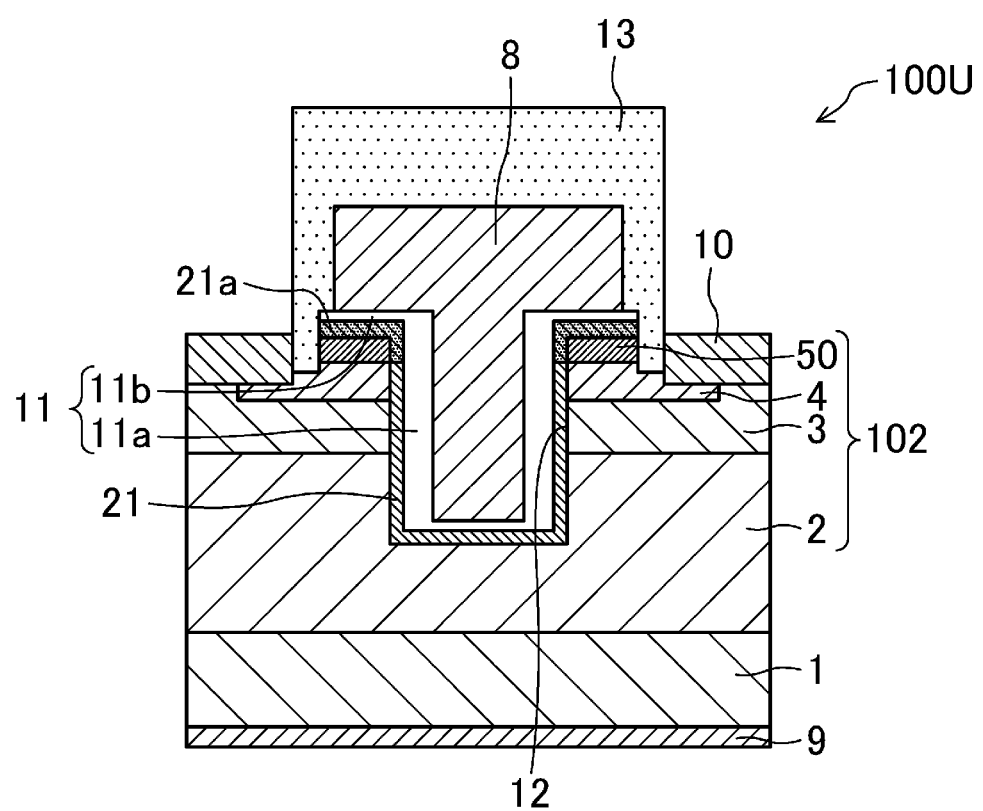
[FIG. 19]

FIG. 19 illustrates the cross-sectional structure of the semiconductor device according to the sixth embodiment.

The semiconductor device of this embodiment is a SiC-metal insulator semiconductor field effect transistor (MISFET) having a trench gate structure, and includes a plurality of unit cells 100U, similar to the structure of the semiconductor device according to the first embodiment shown in FIG. 1 as viewed from above. As shown in FIG. 19, each of the unit cells 100U includes a semiconductor layer 102 provided on a front surface (i.e., a principal surface) of a substrate 1 containing SiC. The semiconductor layer 102 includes an n-type drift region 2, a p-type body region 3 provided on the drift region 2, and an n-type source region 4 provided in the upper portion of the body region 3. The source region 4 is surrounded by the body region 3.

In this embodiment, the p-type impurity region 50 is formed on the source region 4.

As shown in FIG. 19, the semiconductor layer 102 includes a trench (i.e., a recess) 12, which penetrates the p-type impurity region 50, the source region 4, and the body region 3, and reaches the drift region 2. An n-type channel layer 21 is formed on the sidewall surface and the bottom of the trench 12, and on the semiconductor layer 102 around the trench 12. The portion of the n-type channel layer 21, which is in contact with the p-type impurity region 50, is a depletion layer 21a.

In this embodiment, the surfaces of the p-type impurity region 50 and the depletion layer 21a (i.e., the surfaces opposite to the trench 12) are substantially flush (i.e., form a continuous plane), and the side surfaces are exposed from the source region 4.

In this embodiment, as shown in FIG. 19, the side surfaces of the p-type impurity region 50 and the depletion layer 21a are substantially perpendicular to the principal surface of the substrate 1. However, the surfaces of the p-type impurity region 50 and the depletion layer 21a may be inclined from the principal surface of the substrate 1 at an angle other than 90°, and the surfaces may have curvature.

The impurity concentration and the depth of the p-type impurity region 50 and the n-type channel layer 21 may be determined, for example, similarly to the fifth embodiment.

The gate insulating film 11 and the gate electrode 8 may have structures similar to those in, for example, the fifth embodiment.

Where the portion of the gate electrode 8 expanding around the trench 12 overlaps the p-type impurity region 50 even a little with the n-type channel layer 21 interposed therebetween, the depletion layer 21a can be formed in the overlapping region, thereby obtaining advantages. However, the entire portion of the gate electrode 8 expanding around the trench 12 preferably overlaps the p-type impurity region 50, in other words, the width of the gate electrode 8 at the portion expanding around the trench 12 is preferably smaller than the width of the p-type impurity region 50 in the direction along the principal surface of the semiconductor layer 102. As a result, the depletion layer 21a is formed across the entire region below the portion of the gate electrode 8 expanding around the trench 12, thereby exhibiting the above-described advantages more significantly.

As shown in FIG. 19, a source electrode (i.e., a source-body electrode) 10, which is electrically coupled to the source region 4 and the body region 3, is provided on the semiconductor layer 102. In this embodiment, the source electrode 10 surrounds the trench 12. The source electrode 10 is provided outside the p-type impurity region 50 as viewed from the trench 12. In addition, an interlayer insulating film 13 covering the gate electrode 8 is provided on the semiconductor layer 102. An opening exposing the source electrode 10 is provided in the interlayer insulating film 13, and the interlayer insulating film 13 covers the side surfaces of the p-type impurity region 50 and the n-type impurity region 21 (i.e., the depletion layer 21a) opposite to the trench 12. As a result, the source electrode 10 is electrically insulated from the p-type impurity region 50.

The drain electrode 9, a gate interconnect, a source interconnect, etc., may have structures similar to those in, for example, the fifth embodiment.

In the above-described fifth embodiment, the p-type impurity region 50 is formed in an insular manner inside the source region 4 to electrically isolate the p-type impurity region 50 from the source electrode 10 (see FIG. 15). Thus, in the above-described semiconductor device according to the fifth embodiment, the source region 4 is exposed on the principal surface of the semiconductor layer 102.

On the other hand, in the sixth embodiment, the surface of the p-type impurity region 50 opposite to the trench 12 is exposed from the source region 4, and covered by the interlayer insulating film 13, thereby electrically isolating the p-type impurity region 50 from the source electrode 10. Thus, different from the fifth embodiment, the exposed region of the source region 4 is not required on the principal surface of the semiconductor layer 102, thereby reducing the chip area. This improves the mass productivity, and increases the filling rate of the unit cells 100U as compared in the same chip area so that a large current flows.

FIGS. 20(a)-20(d), 21(a)-21(d), and 22 are cross-sectional views illustrating steps of a method of manufacturing the semiconductor device according to the sixth embodiment.

Figure 20:
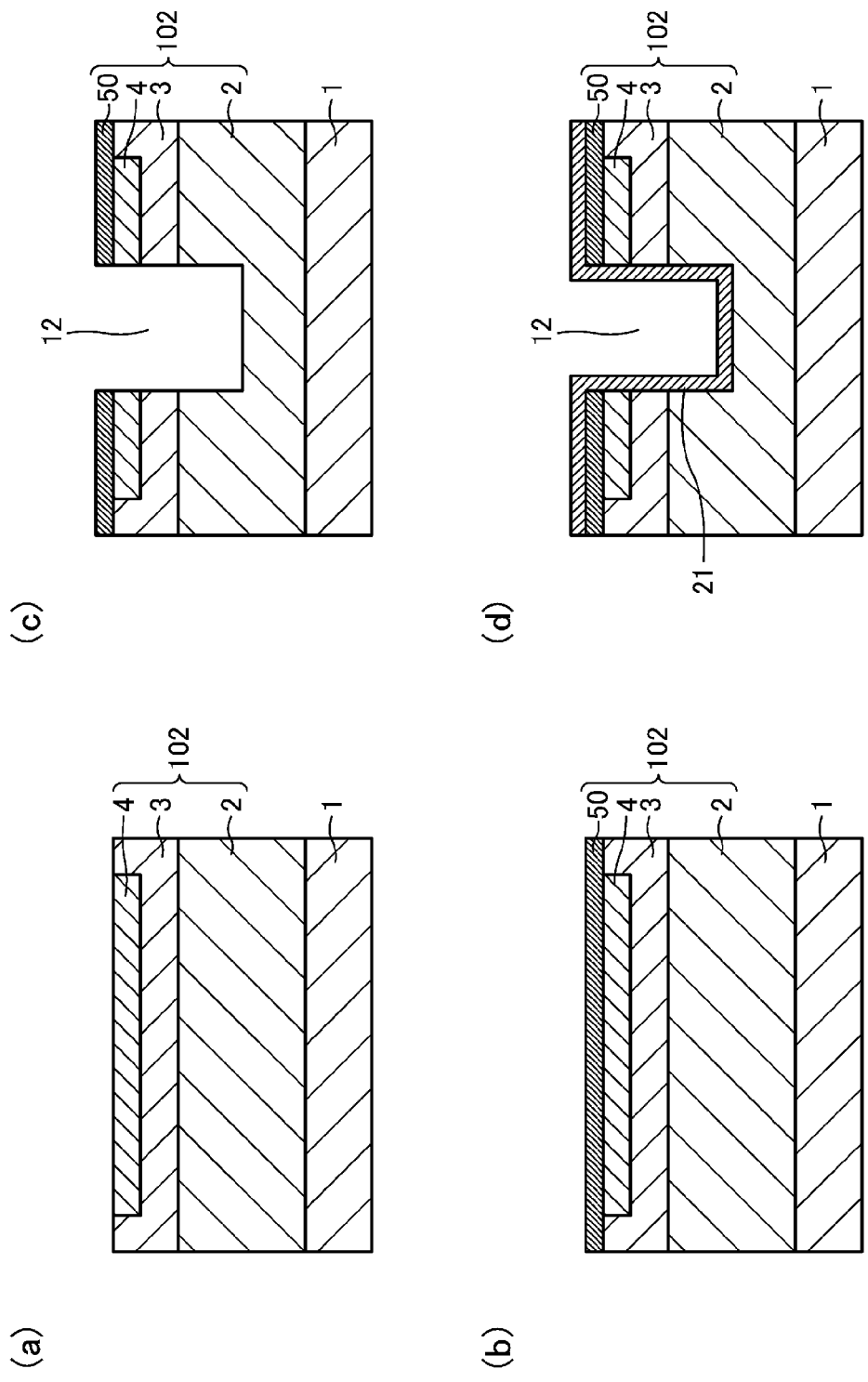
[FIG. 20]

First, similar to the step shown in FIG. 3(a) of the first embodiment, as shown in FIG. 20(a), for example, a SiC layer is epitaxially grown on the principal surface of the substrate 1, thereby sequentially forming the n-type drift region 2 and the p-type body region 3. Then, the n-type source region 4 is formed in the upper portion of the body region 3, for example, by ion implantation.

Then, annealing is performed, for example, under an inert gas atmosphere at a temperature of about 1700° C. for about 30 minutes. This activates impurity ions implanted into the source region 4.

Next, as shown in FIG. 20(b), the p-type impurity region 50 is formed on the principal surface of the semiconductor layer 102, for example, by epitaxial growth. The impurity concentration and the thickness of the p-type impurity region 50 may be determined, for example, similarly to the fifth embodiment. The semiconductor layer 102 referred to in the following description includes the p-type impurity region 50.

While in this embodiment, an example has been described where the p-type impurity region 50 is formed by epitaxial growth, the p-type impurity region 50 may be formed by ion implantation. Where the ion implantation is used, the distribution of the implantation extends in the depth direction. Thus, the epitaxial growth is advantageous in forming a steep PN junction.

After that, as shown in FIG. 20(c), the trench 12 is formed in the semiconductor layer 102. A specific formation method of the trench 12 may be, for example, similar to that in the first embodiment. The trench 12 is formed not to penetrate the drift region 2, and so that the bottom is lower than the interface between the drift region 2 and the body region 3. The trench 12 may have a depth of, for example, about 1.5 μm, and the trench may have a width of, for example, about 1 μm.

While in this embodiment, as shown in FIG. 20(c), an example has been described where the sidewall surface of the trench 12 is perpendicular to the principal surface of the substrate 1, the sidewall surface of the trench 12 may not be perpendicular to the principal surface of the substrate 1.

Then, as shown in FIG. 20(d), a SiC layer is deposited as the n-type channel layer 21, for example, by epitaxial growth on the bottom and the sidewall surface of the trench 12, and on the semiconductor layer 102 around the trench 12. The impurity concentration and the thickness of the n-type channel layer 21 may be determined, for example, similarly to the fifth embodiment.

Figure 21:
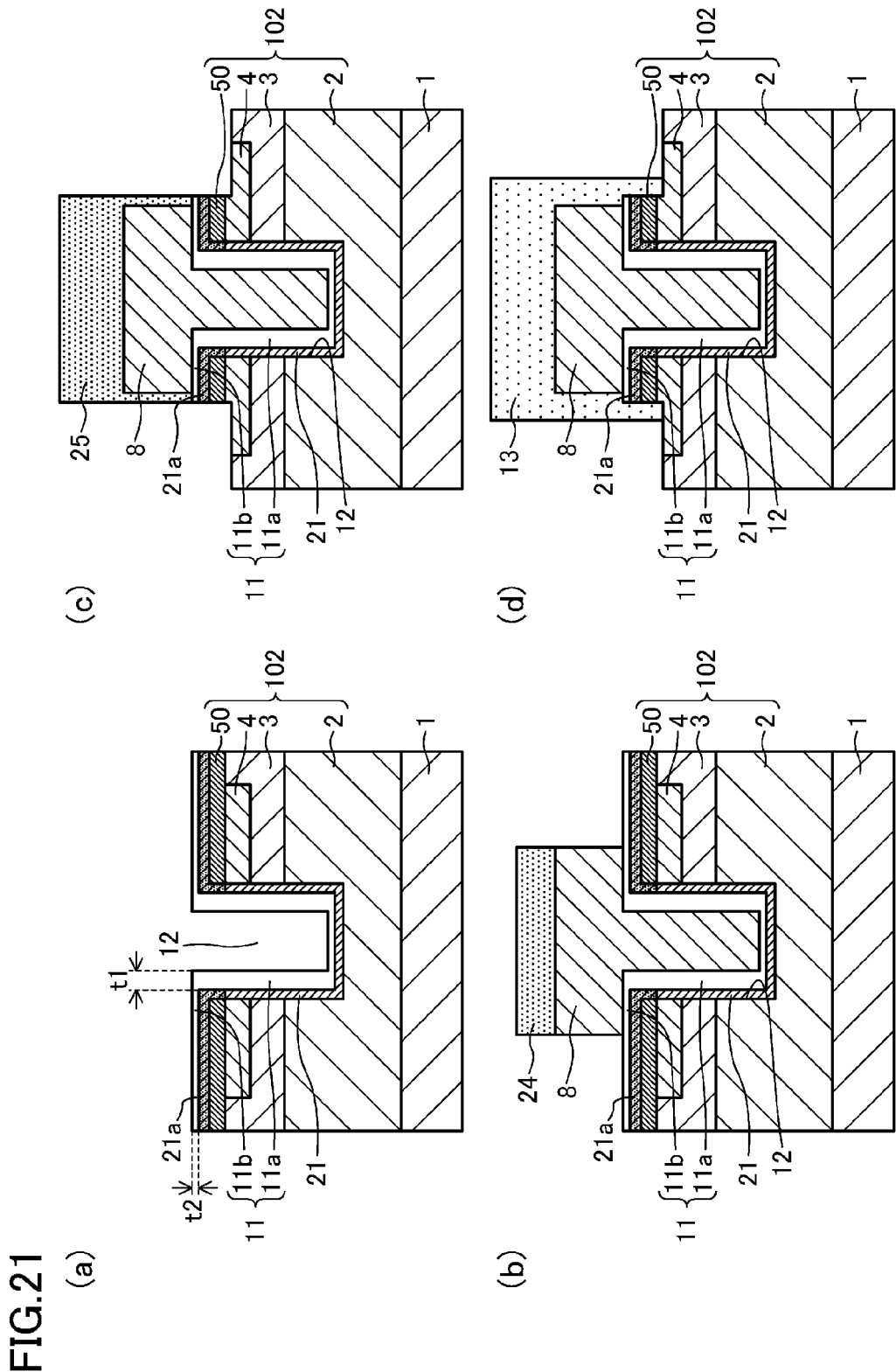
[FIG. 21]

Next, as shown in FIG. 21(a), an oxide film is formed as the gate insulating film 11, for example, by thermal oxidation on the n-type channel layer 21 inside and around the trench 12. Specifically, as the thermal oxidation, thermal treatment is performed, for example, under a dry oxidation atmosphere at a temperature of about 1200° C. for about one hour, thereby forming as part of the gate insulating film 11, the first insulating film 11a with the thickness t1 of, for example, about 70 nm on the (11-20) plane which is the sidewall surface of the trench 12. At this time, the second insulating film 11b with the thickness t2 of, for example, about 30 nm is formed on the (0001) Si plane which is the upper surface of the n-type channel layer 21 around the trench 12. The junction between the p-type impurity region 50 and the portion of the n-type channel layer 21 remaining after the formation of the gate insulating film 11, which is in contact with the p-type impurity region 50, is depleted, and as a result, almost the entire portion becomes the depletion layer 21a.

After that, as shown in FIG. 21(b), a conductive film is formed on the entire surface of the semiconductor layer 102 including the inside of the trench 12, and then, the conductive film is etched by RIE using the photoresist 24 as a mask. As a result, the T-shaped gate electrode 8 is formed on the gate insulating film 11 to fill the trench 12 and expand on the semiconductor layer 102 around the trench 12. The details of the gate electrode 8 including the formation method, etc. may be similar to those in, for example, the fifth embodiment.

Then, as shown in FIG. 21(c), the gate insulating film 11, the n-type channel layer 21 (the depletion layer 21a), the p-type impurity region 50, the source region 4 (the surface portion), and the body region 3 (the surface portion) are removed, for example, by RIE using a photoresist 25 covering the gate electrode 8 and the semiconductor layer 102 around the gate electrode 8 (i.e., the photoresist 25 which is open above part of the source region 4 and the body region 3). Mixed gas containing a compound of fluorine (F) and carbon (C), and oxygen (O) is used in etching the gate insulating film 11. After that, the mixed gas is changed to, for example, chlorine (Cl) gas, thereby etching the n-type channel layer 21, the p-type impurity region 50, the source region 4 (the surface portion), and the body region 3 (the surface portion).

In this embodiment, the surface portion of the source region 4 is also removed partially. As long as the p-type impurity region 50 can be electrically isolated from the source electrode 10 (see FIG. 22), the etching shown in FIG. 21(c) may be ended at the surface of the source region 4. However, in view of variations in the step of etching, the etching preferably reaches the surface portion of the source region 4 to reliably remove the p-type impurity region 50 on the surface of the source region 4 and ensure electrical isolation of the p-type impurity region 50 from the source electrode 10.

In this embodiment, the n-type channel layer 21 and the p-type impurity region 50 are patterned so that the entire portion of the gate electrode 8 expanding around the trench 12 overlaps the p-type impurity region 50 with the n-type channel layer 21 interposed therebetween. As a result, the multilayer of the gate insulating film 11 and the depletion layer 21a, which is the depleted portion of the n-type channel layer 21, can be provided across the entire region below the gate electrode 8 around the trench 12.

After the photoresist 25 is removed, as shown in FIG. 21(d), the interlayer insulating film 13 is formed to cover the gate electrode 8, and the side surfaces (i.e., the side surfaces formed by the patterning) of the p-type impurity region 50 and the n-type channel layer 21 (i.e., the depletion layer 21a).

Then, an opening is formed in the interlayer insulating film 13, for example, by RIE using a resist mask (not shown) exposing part of the source region 4 and the body region 3. For example, CF gas may be used for etching the interlayer insulating film 13. At this time, in order to reliably electrically insulate the p-type impurity region 50 from the source electrode 10 (see FIG. 22), which will be described later, the opening of the interlayer insulating film 13 is formed outside the p-type impurity region 50 and the n-type channel layer 21 (i.e., the depletion layer 21a).

Figure 22:
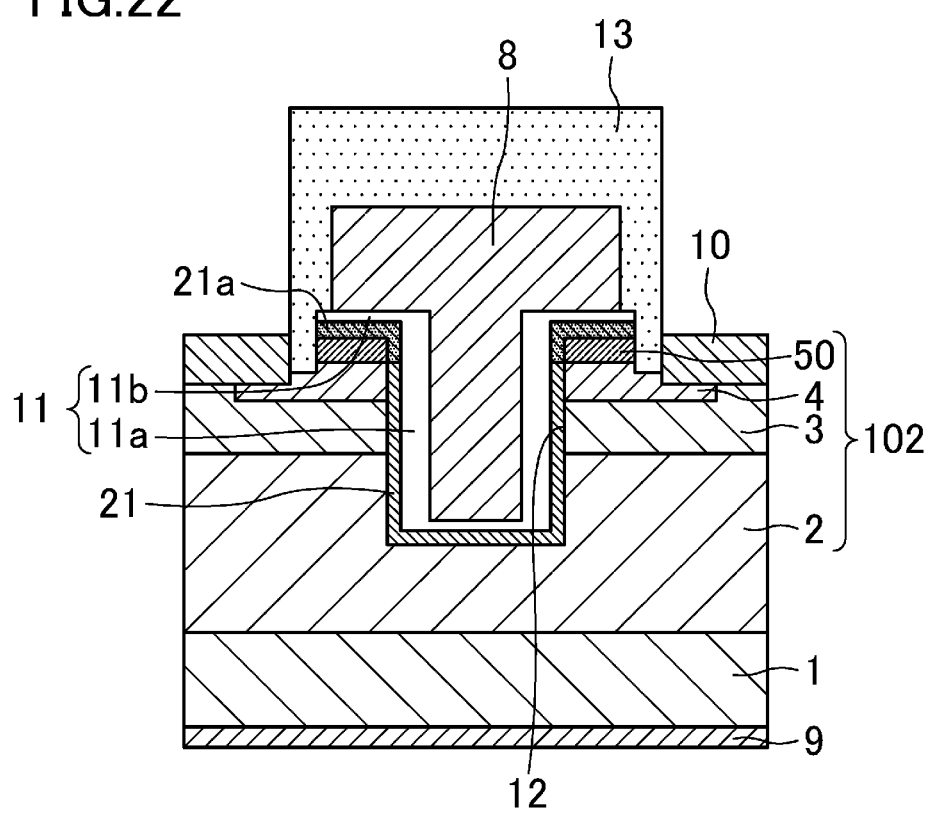
[FIG. 22]

Then, similar to the step shown in FIG. 4(d) of the first embodiment, as shown in FIG. 22, the source electrode 10, the drain electrode 9, the gate interconnect, the source interconnect, and plugs, etc. coupling the electrodes to the interconnects are formed.

In the method of the above-described sixth embodiment, the step of forming a mask for forming the p-type impurity region 50 by ion implantation can be omitted, as compared to the manufacturing method of the fifth embodiment. In particular, where SiC is used as a material of the substrate 1, the ion implantation needs to be performed at a high temperature of 500° C., which requires the plurality of steps such as deposition of an oxide film, etc., which serves as a hard mask, pattern formation with photoresist, pattern transfer by etching the oxide film, etc., and removal of the photoresist to from an ion implantation mask. As a result, in the sixth embodiment, in which the p-type impurity region 50 is formed by epitaxial growth without using ion implantation, the number of the steps largely decreases, and the mass productivity significantly improves.

Similar to the fifth embodiment, the sixth embodiment mitigates an increase in the gate-source capacitance, increases the breakdown voltage of the gate insulating film 11, and increases the cross-sectional area of the gate electrode 8, thereby easily mitigating an increase in the gate resistance.

Seventh Embodiment

An example semiconductor device and a method of manufacturing the device according to a seventh embodiment will be described hereinafter with reference to the drawings.

Figure 23:
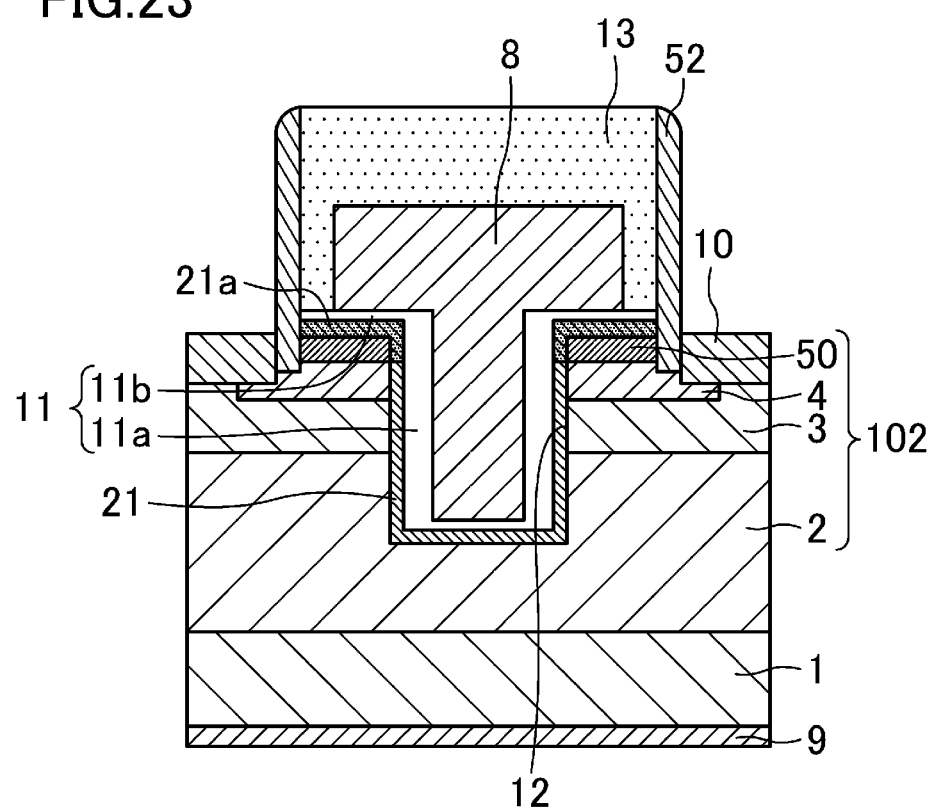
[FIG. 23]

FIG. 23 illustrates the cross-sectional structure of the semiconductor device according to the seventh embodiment.

The semiconductor device of this embodiment is a SiC-metal insulator semiconductor field effect transistor (MISFET) having a trench gate structure, and includes a plurality of unit cells 100U, similar to the structure of the semiconductor device according to the first embodiment shown in FIG. 1 as viewed from above. As shown in FIG. 23, each of the unit cells 100U includes a semiconductor layer 102 provided on a front surface (i.e., a principal surface) of a substrate 1 containing SiC. The semiconductor layer 102 includes an n-type drift region 2, a p-type body region 3 provided on the drift region 2, and an n-type source region 4 provided in the upper portion of the body region 3. The source region 4 is surrounded by the body region 3.

In this embodiment, the p-type impurity region 50 is formed on the source region 4.

As shown in FIG. 23, the semiconductor layer 102 includes a trench (i.e., a recess) 12, which penetrates the p-type impurity region 50, the source region 4, and the body region 3, and reaches the drift region 2. An n-type channel layer 21 is formed on the sidewall surface and the bottom of the trench 12, and on the semiconductor layer 102 around the trench 12. The portion of the n-type channel layer 21, which is in contact with the p-type impurity region 50, is a depletion layer 21a.

In this embodiment, the surfaces of the p-type impurity region 50 and the depletion layer 21a (i.e., the surfaces opposite to the trench 12) are substantially flush (i.e., form a continuous plane), and the side surfaces are exposed from the source region 4.

In this embodiment, as shown in FIG. 23, the side surfaces of the p-type impurity region 50 and the depletion layer 21a are substantially perpendicular to the principal surface of the substrate 1. However, the surfaces of the p-type impurity region 50 and the depletion layer 21a may be inclined from the principal surface of the substrate 1 at an angle other than 90°, and the surfaces may have curvature.

The impurity concentration and the depth of the p-type impurity region 50 and the n-type channel layer 21 may be determined, for example, similarly to the fifth embodiment.

The gate insulating film 11 and the gate electrode 8 may have structures similar to those in, for example, the fifth embodiment.

Where the portion of the gate electrode 8 expanding around the trench 12 overlaps the p-type impurity region 50 even a little with the n-type channel layer 21 interposed therebetween, the depletion layer 21a can be formed in the overlapping region, thereby obtaining advantages. However, the entire portion of the gate electrode 8 expanding around the trench 12 preferably overlaps the p-type impurity region 50, in other words, the width of the gate electrode 8 at the portion expanding around the trench 12 is preferably smaller than the width of the p-type impurity region 50 in the direction along the upper surface of the semiconductor layer 102. As a result, the depletion layer 21a is formed across the entire region below the portion of the gate electrode 8 expanding around the trench 12, thereby exhibiting the above-described advantages more significantly.

As shown in FIG. 23, a source electrode (i.e., a source-body electrode) 10, which is electrically coupled to the source region 4 and the body region 3, is provided on the semiconductor layer 102. In this embodiment, the source electrode 10 surrounds the trench 12. The source electrode 10 is provided outside the p-type impurity region 50 as viewed from the trench 12, and is electrically insulated from the p-type impurity region 50 by an insulating sidewall spacer 52. In addition, an interlayer insulating film 13 covering the gate electrode 8 is provided on the semiconductor layer 102. An opening exposing the source electrode 10 is provided in the interlayer insulating film 13, and the sidewall surface of the opening close to the gate electrode 8 is covered by the insulating sidewall spacer 52 as well as the side surfaces of the p-type impurity region 50 and the n-type channel layer 21 (i.e., the depletion layer 21a) opposite to the trench 12.

The drain electrode 9, a gate interconnect, a source interconnect, etc., may have structures similar to those in, for example, the fifth embodiment.

In the above-described sixth embodiment, the spaces are provided between the p-type impurity region 50 and the source electrode 10 to electrically insulate the p-type impurity region 50 from the source electrode 10 (see FIG. 19). Specifically, spaces of about hundreds of nm are preferably provided as the spaces in view of variation in sizes, misalignment, etc., in conventional photolithography.

On the other hand, in the seventh embodiment, the sidewall surface of the opening in the interlayer insulating film 13 is substantially in the same position as the surfaces of the p-type impurity region 50 and the n-type channel layer 21 (i.e., the depletion layer 21a) to form the source electrode 10, and the insulating sidewall spacer 52 is used for electrical isolation of the p-type impurity region 50 from the source electrode 10. Thus, the p-type impurity region 50 can be electrically isolated from the source electrode 10 by a distance of, for example, about 100 nm or less, thereby further reducing the chip area. This improves the mass productivity, and increases the filling rate of the unit cells 100U as compared in the same chip area so that a large current flows.

FIGS. 24(a)-24(d) are cross-sectional views illustrating steps of a method of manufacturing the example semiconductor device according to the seventh embodiment.

Figure 24:
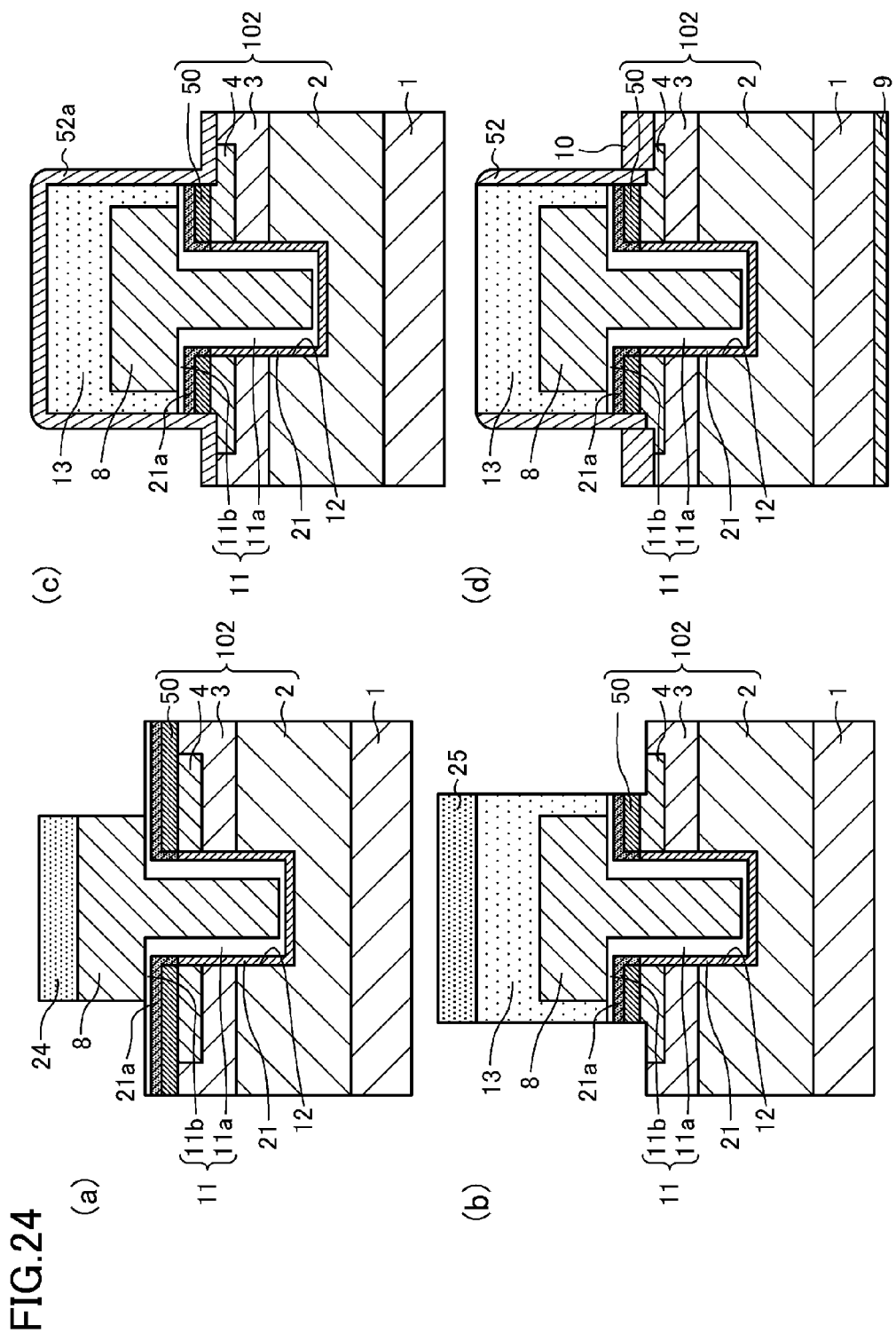
[FIG. 24]

First, for example, the steps in the method of manufacturing the semiconductor device according to the sixth embodiment shown in FIGS. 20(a)-20(d), 21(a), and 21(b) are performed to obtain the structure shown FIG. 24(a) (i.e., the same structure as shown in FIG. 21(b)).

After the photoresist 24 is removed, as shown in FIG. 24(b), the interlayer insulating film 13 is deposited on the entire surface of the semiconductor layer 102 including the top of the gate electrode 8. Then, the interlayer insulating film 13 is open, and the gate insulating film 11, the n-type channel layer 21 (i.e., the depletion layer 21a), the p-type impurity region 50, the source region 4 (the surface portion) and the body region 3 (the surface portion) are removed, for example, by RIE using a photoresist 25 covering the gate electrode 8 and the semiconductor layer 102 around the gate electrode 8 (i.e., the photoresist 25 which is open above part of the source region 4 and the body region 3). Mixed gas containing a compound of fluorine (F) and carbon (C), and oxygen (O) is used in etching the interlayer insulating film 13 and the gate insulating film 11. After that, the mixed gas is changed to, for example, chlorine (Cl) gas, thereby etching the n-type channel layer 21 (i.e., the depletion layer 21a), the p-type impurity region 50, the source region 4 (the surface portion), and the body region 3 (the surface portion).

In this embodiment as well, similar to the sixth embodiment, the surface portion of the source region 4 is also removed partially by etching. In the sixth embodiment, the distance between the source electrode 10 and the p-type impurity region 50 is sufficiently long, it is less problematic even if the etching stops in the middle of the p-type impurity region 50. However, in the seventh embodiment, since the p-type impurity region 50 is electrically isolated from the source electrode 10 by the insulating sidewall spacer 52 with a small width (see FIG. 24(d)), the portion of the p-type impurity region 50 in the opening of the interlayer insulating film 13 needs to be completely removed. Therefore, in view of variations in the step of etching, the etching preferably reaches the surface portion of the source region 4.

In this embodiment, the n-type channel layer 21 and the p-type impurity region 50 are patterned so that the entire portion of the gate electrode 8 expanding around the trench 12 overlaps the p-type impurity region 50 with the n-type channel layer 21 interposed therebetween. As a result, the multi-layer of the gate insulating film 11 and the depletion layer 21a of the n-type channel layer 21 can be provided across the entire region below the gate electrode 8 around the trench 12.

Next, after the photoresist 25 is removed, as shown in FIG. 24(c), for example, an oxide film is deposited as an insulating film 52a, which will be the insulating sidewall spacer 52 (see FIG. 24(d)), on the entire surface of the semiconductor layer 102 including the top of the interlayer insulating film 13. The insulating film 52a can be easily deposited, for example, by CVD.

Then, as shown in FIG. 24(d), the insulating film 52a is etched, for example, by RIE, thereby forming the insulating sidewall spacer 52 to cover the side surfaces (i.e., the side surfaces formed by patterning) of the interlayer insulating film 13, the n-type impurity region 51, and the p-type impurity region 50. The RIE is easily performed using, for example, mixed gas containing a compound of fluorine (F) and carbon (C), and oxygen (O). After that, similar to the step shown in FIG. 4(d) of the first embodiment, the source electrode 10, the drain electrode 9, the gate interconnect, the source interconnect, etc., are formed.

In the method of the above-described seventh embodiment, since the step of partially removing the p-type impurity region 50 and the n-type channel layer 21 (i.e., the depletion layer 21a) is performed at the same time as the step of forming the opening in the interlayer insulating film 13, the step of forming a mask for partially removing the p-type impurity region 50 and the n-type channel layer 21 (i.e., the depletion layer 21a) can be omitted, as compared to the manufacturing method of the sixth embodiment. Therefore, the number of the steps decreases, and the mass productivity significantly improves in the seventh embodiment.

Similar to the fifth embodiment, the seventh embodiment mitigates an increase in the gate-source capacitance, increases the breakdown voltage of the gate insulating film 11, and increases the cross-sectional area of the gate electrode 8, thereby easily mitigating an increase in the gate resistance.

Eighth Embodiment

An example semiconductor device and a method of manufacturing the device according to an eighth embodiment will be described hereinafter with reference to the drawings.

Figure 25:
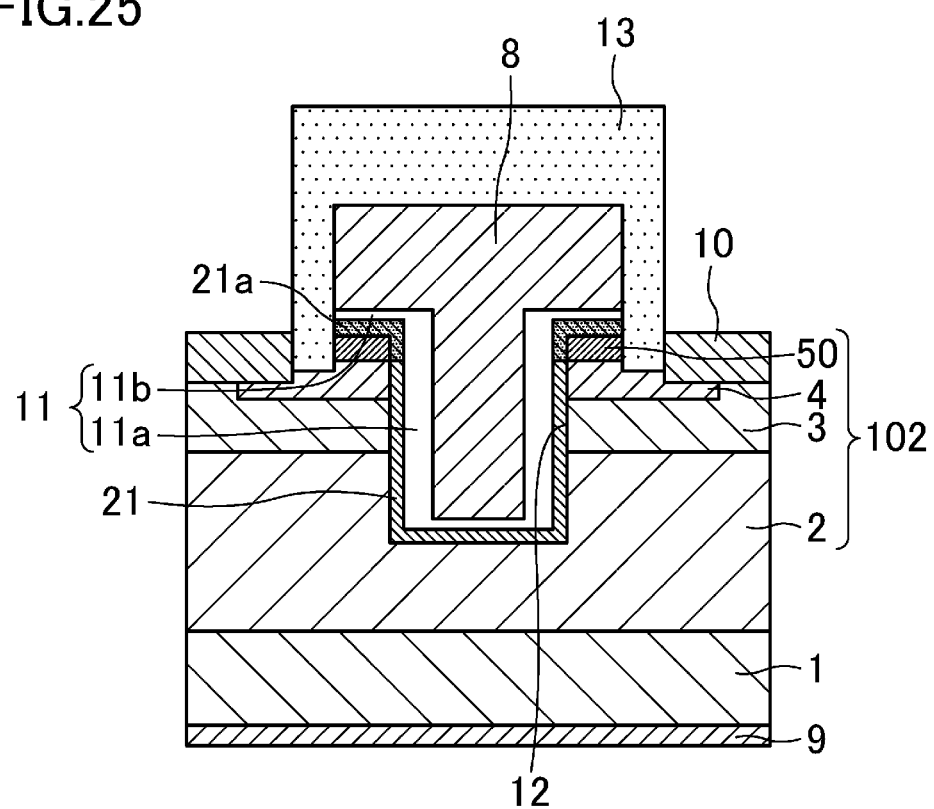
[FIG. 25]

FIG. 25 illustrates the cross-sectional structure of the semiconductor device according to the eighth embodiment.

The semiconductor device of this embodiment is a SiC-metal insulator semiconductor field effect transistor (MISFET) having a trench gate structure, and includes a plurality of unit cells 100U, similar to the structure of the semiconductor device according to the first embodiment shown in FIG. 1 as viewed from above. As shown in FIG. 25, each of the unit cells 100U includes a semiconductor layer 102 provided on a front surface (i.e., a principal surface) of a substrate 1 containing SiC. The semiconductor layer 102 includes an n-type drift region 2, a p-type body region 3 provided on the drift region 2, and an n-type source region 4 provided in the upper portion of the body region 3. The source region 4 is surrounded by the body region 3.

In this embodiment, the p-type impurity region 50 is formed on the source region 4.

As shown in FIG. 25, the semiconductor layer 102 includes a trench (i.e., a recess) 12, which penetrates the p-type impurity region 50, the source region 4, and the body region 3, and reaches the drift region 2. An n-type channel layer 21 is formed on the sidewall surface and the bottom of the trench 12, and on the semiconductor layer 102 around the trench 12. The portion of the n-type channel layer 21, which is in contact with the p-type impurity region 50, is a depletion layer 21a.

In this embodiment, the surfaces of the p-type impurity region 50 and the depletion layer 21a (i.e., the surfaces opposite to the trench 12) are substantially flush (i.e., form a continuous plane), and the side surfaces are exposed from the source region 4.

In this embodiment, as shown in FIG. 25, the side surfaces of the p-type impurity region 50 and the depletion layer 21a are substantially perpendicular to the principal surface of the substrate 1. However, the surfaces of the p-type impurity region 50 and the depletion layer 21a may be inclined from the principal surface of the substrate 1 at an angle other than 90°, and the surfaces may have curvature.

The impurity concentration and the depth of the p-type impurity region 50 and the n-type channel layer 21 may be determined, for example, similarly to the fifth embodiment.

The gate insulating film 11 and the gate electrode 8 may have structures similar to those in, for example, the fifth embodiment.

Where the portion of the gate electrode 8 expanding around the trench 12 overlaps the p-type impurity region 50 even a little with the n-type channel layer 21 interposed therebetween, the depletion layer 21a can be formed below the overlapping region, thereby obtaining advantages. However, the entire portion of the gate electrode 8 expanding around the trench 12 preferably overlaps the p-type impurity region 50, in other words, the width of the gate electrode 8 at the portion expanding around the trench 12 is preferably smaller than or equal to the width of the p-type impurity region 50 in the direction along the principal surface of the substrate 1. For example, in this embodiment, the side surfaces of the p-type impurity region 50 and the n-type channel layer 21 (i.e., the depletion layer 21a) opposite to the trench 12 are substantially flush with (i.e., form a continuous plane with) the side surface of the gate electrode 8 around the trench 12. Thus, the width of the gate electrode 8 at the portion expanding around the trench 12 is nearly equal to the width of the p-type impurity region 50 (i.e., the width of the depletion layer 21a). As a result, the depletion layer 21a is formed across the entire region below the portion of the gate electrode 8 expanding around the trench 12, thereby exhibiting the above-described advantages more significantly.

As shown in FIG. 25, a source electrode (i.e., a source-body electrode) 10, which is electrically coupled to the source region 4 and the body region 3, is provided on the semiconductor layer 102. In this embodiment, the source electrode 10 surrounds the trench 12. The source electrode 10 is provided outside the p-type impurity region 50 as viewed from the trench 12. In addition, an interlayer insulating film 13 covering the gate electrode 8 is provided on the semiconductor layer 102. The interlayer insulating film 13 also covers the side surfaces of the p-type impurity region 50 and the n-type channel layer 21 (i.e., the depletion layer 21a) opposite to the trench 12. An opening exposing the source electrode 10 is provided in the interlayer insulating film 13. The p-type impurity region 50 is electrically insulated from the source electrode 10 by the interlayer insulating film 13.

The drain electrode 9, a gate interconnect, a source interconnect, etc., may have structures similar to those in, for example, the fifth embodiment.

In the above-described seventh embodiment, the insulating sidewall spacer 52 is used for electrical isolation of the p-type impurity region 50 from the source electrode 10. This increases the chip area by the width of the insulating sidewall spacer 52. In general, where an insulating sidewall spacer is used, electrical isolation, for example, by about 100 nm or less is possible.

On the other hand, in the eighth embodiment, the side surface of the gate electrode 8 around the trench 12 is substantially flush with (i.e., forms a continuous plane with) the side surfaces of the p-type impurity region 50 and the n-type channel layer 21 (i.e., the depletion layer 21a) opposite to the trench 12, thereby reducing the chip area by the width of the insulating sidewall spacer 52, as compared to the seventh embodiment. This improves the mass productivity, and increases the filling rate of the unit cells 100U as compared in the same chip area so that a large current flows.

FIG. 25 illustrates that the side surface of the gate electrode 8 around the trench 12 is substantially flush with (i.e., forms a continuous plane with) the side surfaces of the p-type impurity region 50 and the n-type channel layer 21 (i.e., the depletion layer 21a) opposite to the trench 12.

On the other hand, as in the variation of the above-described fourth embodiment shown in FIG. 13(a), a gate electrode oxide film 60 (e.g., with a thickness t4) may be formed around the gate electrode 8 by thermal oxidation so that the gate electrode 8 recovers from a damage caused by the etching in forming the gate electrode 8. In this case, since the size of the gate electrode 8 is reduced by about half the thickness t4, the side surfaces of the p-type impurity region 50 and the n-type channel layer 21 (i.e., the depletion layer 21a) opposite to the trench 12 are spaced apart from the side surface of the gate electrode 8 around the trench 12 by about ½×t4. Where the gate electrode oxide film 60 has a thickness of, for example, about 50 nm or less, the distance between the side surface of the gate electrode 8 around the trench 12 and the side surfaces of the p-type impurity region 50 and the n-type channel layer 21 (i.e., the depletion layer 21a) opposite to the trench 12 are about 25 nm or less.

In this embodiment, etching of the gate insulating film 11 is required between the etching for forming the gate electrode 8, and the etching for removing the n-type channel layer 21 (i.e., the depletion layer 21a) and the p-type impurity region 50. As in the variation of the above-described fourth embodiment shown in FIG. 13(a), the gate insulating film 11 may be etched to have a taper or a step with a width t5. In this case, the side surfaces of the p-type impurity region 50 and the n-type channel layer 21 (i.e., the depletion layer 21a) opposite to the trench 12 are spaced apart from the side surface of the gate electrode 8 around the trench 12 by about t5. Since the width t5 of the taper or the step of the gate insulating film 11 is generally about twice or less the thickness of the gate insulating film 11 which is the material to be etched (specifically, the thickness of about 30 nm of the second insulating film 11b (see the first embodiment)), t5 is, for example, about 60 nm or less.

Clearly, as in the variation of the above-described fourth embodiment shown in FIG. 13(c), where the gate insulating film 11 has the taper or the step of the width t5, the gate electrode oxide film 60 may be formed. In this case, the side surfaces of the p-type impurity region 50 and the n-type channel layer 21 (i.e., the depletion layer 21a) opposite to the trench 12 are spaced apart from the side surface of the gate electrode 8 around the trench 12 by about (½×t4)+t5. In view of the above-described values, the distance is about 85 nm or less.

In the fifth to seventh embodiments, a gate electrode oxide film 60 may be formed, or the gate insulating film 11 may have a taper or a step.

Figure 26:
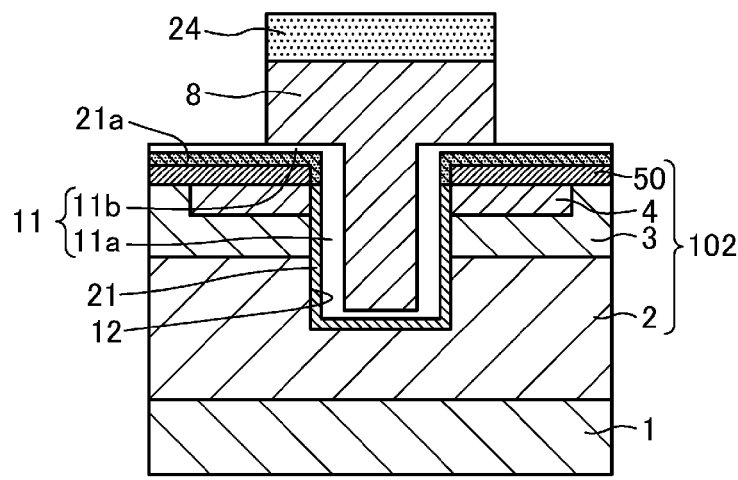
[FIG. 26]
Figure 26:
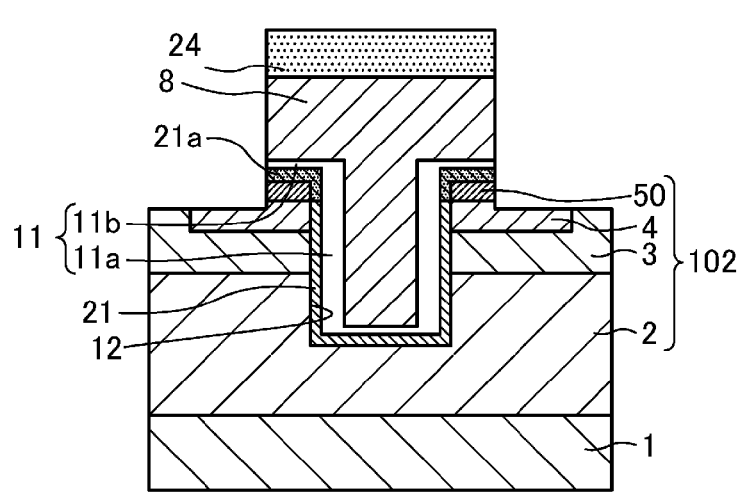
Figure 26:
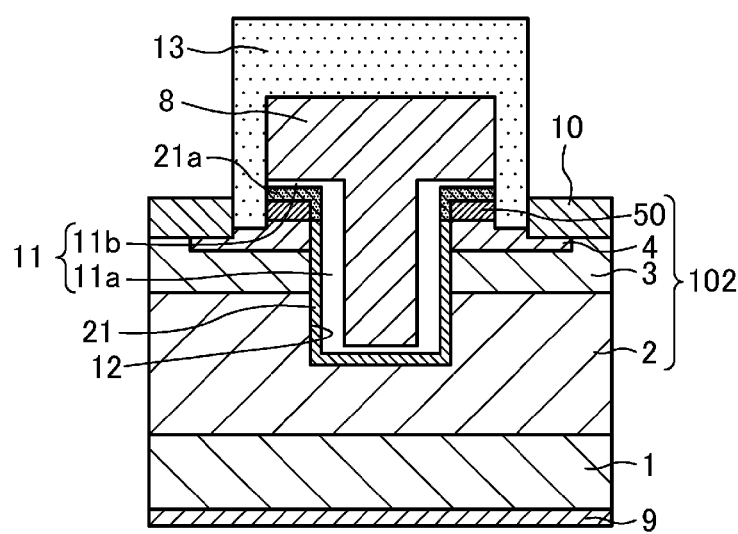

FIGS. 26(a)-26(c) are cross-sectional views illustrating steps of a method of manufacturing the example semiconductor device according to the eighth embodiment.

First, for example, the steps in the method of manufacturing the semiconductor device according to the sixth embodiment shown in FIGS. 20(a)-20(d), 21(a), and 21(b) are performed to obtain the structure shown FIG. 26(a) (i.e., the same structure as shown in FIG. 21(b)).

Then, as shown in FIG. 26(b), after the gate insulating film 11 is open using a photoresist 24, which is an etching mask for forming the gate electrode 8, the n-type channel layer 21 (i.e., the depletion layer 21a), the p-type impurity region 50, the source region 4 (the surface portion), and the body region 3 (the surface portion) are sequentially removed. Mixed gas containing a compound of fluorine (F) and carbon (C), and oxygen (O) is used in etching the gate insulating film 11. After that, the mixed gas is changed to, for example, chlorine (Cl) gas, thereby etching the n-type channel layer 21 (i.e., the depletion layer 21a), the p-type impurity region 50, the source region 4 (the surface portion), and the body region 3 (the surface portion).

In this embodiment as well, similar to the sixth embodiment, the surface portion of the source region 4 is also removed partially by etching. In the sixth embodiment, since the distance between the source electrode 10 and the p-type impurity region 50 is sufficiently long, it is less problematic even if the etching stops in the middle of the p-type impurity region 50. However, in the eighth embodiment, the p-type impurity region 50 needs to be completely removed in a region outside the gate electrode 8 including the opening of the interlayer insulating film 13 (see FIG. 26(C)), which will be described layer, to electrically isolate the p-type impurity region 50 from the source electrode 10. Therefore, in view of variations in the step of etching, the etching preferably reaches the surface portion of the source region 4.

In this embodiment, the n-type channel layer 21 and the p-type impurity region 50 are patterned so that the entire portion of the gate electrode 8 expanding around the trench 12 overlaps the p-type impurity region 50 with the n-type channel layer 21 interposed therebetween. As a result, the multilayer of the gate insulating film 11 and the depletion layer 21a of the n-type channel layer 21 can be provided across the entire region below the gate electrode 8 around the trench 12.

After the photoresist 24 is removed, similar to the step shown in FIG. 21(d) of the sixth embodiment, as shown in FIG. 26(c), the interlayer insulating film 13 is formed, and then, similar to the step shown in FIG. 4(d) of the first embodiment, the source electrode 10, the drain electrode 9, the gate interconnect, the source interconnect, etc., are formed.

In the method of the above-described eighth embodiment, the step of forming the insulating sidewall spacer 52 can be omitted, as compared to the manufacturing method of the seventh embodiment. Therefore, the number of the steps decreases, and the mass productivity significantly improves in the eighth embodiment.

Similar to the fifth embodiment, the eighth embodiment mitigates an increase in the gate-source capacitance, increases the breakdown voltage of the gate insulating film 11, and increases the cross-sectional area of the gate electrode 8, thereby easily mitigating an increase in the gate resistance.

In the sixth to eighth embodiments, an example has been described where the upper corner of the trench 12 has almost a right angle. However, similar to the variation of the fifth embodiment shown in FIG. 18, the upper corner of the trench 12 may be rounded to be a curbed corner in the sixth to eighth embodiments. The method of rounding the upper corner of the trench 12 is similar to that in the variation of the fifth embodiment.

While the n-type MISFETs have been described in the first to eighth embodiments, the technique of the present disclosure is applicable to p-type MISFETs. In this case, a substrate 1, a drift region 2, an n-type impurity region 51 (or an n-type channel layer 21), and a source region 4 may have p-type conductivity, and a p-type impurity region 50 and a body region 3 may have n-type conductivity. A semiconductor layer 102 may further include an impurity region other than the n-type impurity region 51, the p-type impurity region 50, the drift region 2, the body region 3, and the source region 4. For example, in order to reduce the electric filed, an impurity region having a different conductivity type from the drift region 2 may be provided in the drift region 2 near the bottom of the trench 12.

Application of the technique of the present disclosure is not limited to MISFETs, and the technique is applicable to various semiconductor devices including an electrode on a semiconductor layer with an insulating film interposed between. For example, a substrate and a semiconductor layer formed directly thereon have different conductivity types, thereby forming an insulated gate bipolar transistor (IGBT), to which the technique of the present disclosure is applicable.

In an IGBT, the source electrode, the drain electrode, and the source region in each of the above-described embodiments are called an emitter electrode, a collector electrode, and an emitter region, respectively. In each of the above-described embodiments, where the drift region and the emitter region have n-type conductivity, and the substrate and the body region have p-type conductivity, an n-type IGBT can be obtained. At this time, an n-type buffer layer may be provided between the p-type substrate and the n-type drift layer. Where the drift region and the emitter region have p-type conductivity, and the substrate and the body region have n-type conductivity, a p-type IGBT can be obtained. At this time, a p-type buffer layer may be provided between the n-type substrate and the p-type drift layer.

While in the above-described embodiments, an example have been described where the plurality of unit cells are arranged in a grid, the arrangement of the unit cells are clearly not particularly limited thereto. An example has been described where each trench has the rectangular plane, the planar shape of the trench is not limited thereto. For example, the unit cells may be arranged so that each trench has a square plane and the plurality of trenches are arranged in a grid or a houndstooth check.

In the above-described embodiments, an example has been described above where the substrate 1 is made of 4H—SiC, and the semiconductor layer 102 is formed to on the (0001) Si plane of the substrate 1. However, the semiconductor layer 102 may be formed on the (000-1) C-plane of the substrate 1, and the drain electrode 9 may be formed on the (0001) Si plane. The orientation of the principal surface of the substrate 1 may be other crystal planes. Furthermore, a SiC substrate of other polytypes may be used as the substrate 1.

While in the above-described embodiments, an example has been described where the gate electrode 8 fills the trench 12, the gate electrode 8 may not fill the trench 12. Specifically, the gate electrode 8 may be formed on at least the portion of the gate insulating film 11, which is inside the trench 12 and covers the body region 3, and on at least part of the gate insulating film 11 on the semiconductor layer 102 around the trench 12.

While in the above-described embodiments, the semiconductor devices made of SiC has been described, the technique of the present disclosure is applicable to semiconductor devices made of other widegap semiconductor such as gallium nitride (GaN) or diamond. The technique of the present disclosure is also applicable to semiconductor devices made of silicon.

Industrial Applicability

The semiconductor device and method of manufacturing the device according to the technique shown in the present disclosure is useful for various semiconductor devices including power devices, etc., and methods of manufacturing the devices.

DESCRIPTION OF REFERENCE CHARACTERS

1 Substrate
2 Drift Region
3 Body Region
4 Source Region
8 Gate Electrode
9 Drain Electrode
10 Source Electrode
11 Gate Insulating Film
11a First Insulating Film
11b Second Insulating Film
12 Trench 13 Interlayer Insulating Film
21 N-Type Channel Layer
21a Depletion Layer
24 Photoresist
25 Photoresist
50 P-Type Impurity Region
51 N-Type Impurity Region
52 Insulating Sidewall Spacer
52a Insulating Film
60 Gate Electrode Oxide Film
100 Semiconductor Device
100U Unit Cell
102 Semiconductor Layer

The invention claimed is:

1. A semiconductor device, comprising:
a substrate having a semiconductor layer on a principal surface thereof;
a trench provided in the semiconductor layer;
a first first-conductivity-type impurity region provided in an upper portion of the semiconductor layer around the trench;
a gate insulating film provided on a sidewall surface of the trench and on the portion of the semiconductor layer around the trench;
a gate electrode provided on a portion of the gate insulating film inside the trench, and on the gate insulating film on the portion of the semiconductor layer around the trench; and
another electrode directly contacting the first first-conductivity-type impurity region, wherein:
a second-conductivity-type impurity region and a second first-conductivity-type impurity region are interposed around the trench between a portion of the gate electrode and the first-first-conductivity-type impurity region, and are formed sequentially on the first first-conductivity-type impurity region.

2. The device of claim 1, wherein
a side surface of the second-conductivity-type impurity region opposite to the trench is surrounded by the first first-conductivity-type impurity region.

3. The device of claim 1, wherein
side surfaces of the second-conductivity-type impurity region and the second first-conductivity-type impurity region opposite to the trench are substantially flush with each other, and are exposed from the first first-conductivity-type impurity region.

4. The device of claim 3, wherein
the side surfaces of the second-conductivity-type impurity region and the second first-conductivity-type impurity region opposite to the trench are covered by an insulating film together with the gate electrode.

5. The device of claim 3, wherein
the side surfaces of the second-conductivity-type impurity region and the second first-conductivity-type impurity region opposite to the trench are covered by an insulating sidewall spacer.

6. The device of claim 3, wherein
the side surfaces of the second-conductivity-type impurity region and the second first-conductivity-type impurity region opposite to the trench are substantially flush with a side surface of the gate electrode at the portion around the trench.

7. The device of claim 1, further comprising:
a channel layer provided on a surface of the semiconductor layer which is the sidewall surface of the trench.

8. The device of claim 1, wherein
the second first-conductivity-type impurity region is part of the channel layer provided on the sidewall surface of the trench and on the portion of the semiconductor layer around the trench.

9. The device of claim 8, wherein
a portion of the channel layer, which will be the second first-conductivity-type impurity region, is depleted by coming into contact with the second-conductivity-type impurity region.

10. The device of claim 1, wherein
the another electrode is spaced apart from the second-conductivity-type impurity region.

11. The device of claim 10, further comprising:
an interlayer insulating film provided to cover the gate electrode, wherein
an opening, in which the another electrode is formed, is provided in the interlayer insulating film.

12. The device of claim 1, wherein
the semiconductor layer is made of silicon carbide.

13. The device of claim 12, wherein
the substrate is a silicon carbide substrate, and
the principal surface of the substrate is a silicon surface.

14. A method of manufacturing a semiconductor device, the method comprising:
preparing a substrate having a semiconductor layer on a principal surface thereof;
forming a first first-conductivity-type impurity region in an upper portion of the semiconductor layer;
forming a second-conductivity-type impurity region on the first first-conductivity-type impurity region;
forming a second first-conductivity-type impurity region on the second-conductivity-type impurity region;
forming a trench in the semiconductor layer;
forming a gate insulating film on a sidewall surface of the trench and on a portion of the semiconductor layer around the trench;
forming a gate electrode on a portion of the gate insulating film inside the trench, and on the gate insulating film on the portion of the semiconductor layer around the trench; and
forming another electrode on the first first-conductivity-type impurity region such that the electrode directly contacts the first first-conductivity-type impurity region, wherein:
the second-conductivity-type impurity region and the second first-conductivity-type impurity region are interposed around the trench between a portion of the gate electrode and the first first-conductivity-type impurity region.

15. The method of claim 14, wherein
the second-conductivity-type impurity region is formed so that a side surface of the second-conductivity-type impurity region is surrounded by the first first-conductivity-type impurity region.

16. The method of claim 14, further comprising:
after the forming the trench, removing the second-conductivity-type impurity region and the second first-conductivity-type impurity region other than portions around the trench, wherein
the second-conductivity-type impurity region is formed to cover an upper surface of the first first-conductivity-type impurity region.

17. The method of claim 16, further comprising:
after the removing the second-conductivity-type impurity region and the second first-conductivity-type impurity region, covering side surfaces of the second-conductivity-type impurity region and the second first-conductivity-type impurity region opposite to the trench with an insulating film together with the gate electrode.

18. The method of claim 16, further comprising:
after the removing the second-conductivity-type impurity region and the second first-conductivity-type impurity region, covering side surfaces of the second-conductivity-type impurity region and the second first-conductivity-type impurity region opposite to the trench with an insulating sidewall spacer.

19. The method of claim 16, wherein
in the removing the second-conductivity-type impurity region and the second first-conductivity-type impurity region, the second-conductivity-type impurity region and the second first-conductivity-type impurity region are removed using a mask for patterning the gate electrode.

20. The method of claim 14, wherein
the forming the second first-conductivity-type impurity region is performed by forming a channel layer including a portion, which will be the second first-conductivity-type impurity region, on the sidewall surface of the trench and on the portion of the semiconductor layer around the trench, between the forming the trench and the forming the gate insulating film.

* * * * *